US012695068B2

(12) United States Patent
Han et al.

(10) Patent No.: US 12,695,068 B2
(45) Date of Patent: Jul. 28, 2026

(54) FOCUS RING AND SUBSTRATE PROCESSING APPARATUS INCLUDING THE SAME

(71) Applicant: Samsung Electronics Co., Ltd., Suwon-si (KR)

(72) Inventors: Dongseok Han, Daegu (KR); Seunghan Baek, Busan (KR); Kyung-Sun Kim, Suwon-si (KR); Nam Kyun Kim, Pyeongtaek-si (KR); Sang Ki Nam, Seongnam-si (KR); Kuihyun Yoon, Yongin-si (KR); Kangmin Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 17/850,478

(22) Filed: Jun. 27, 2022

(65) Prior Publication Data

US 2023/0143327 A1     May 11, 2023

(30) Foreign Application Priority Data

Nov. 9, 2021     (KR) ........................ 10-2021-0153266

(51) Int. Cl.
H01J 37/32 (2006.01)
H10P 72/72 (2026.01)

(52) U.S. Cl.
CPC .. H01J 37/32642 (2013.01); H01J 37/32724 (2013.01); H01J 37/32807 (2013.01); H10P 72/72 (2026.01); H10P 72/722 (2026.01)

(58) Field of Classification Search
CPC ........... H01J 37/32091; H01J 37/32642; H01J 37/32697; H01J 37/32706; H01J 37/32724; H01J 37/32807; C23C 16/45565; C23C 16/4585; C23C 16/4586; C23C 16/505; C23C 16/509; H01L 21/6831; H01L 21/6833; H01L 21/68742; H01L 21/68785;
(Continued)

(56) References Cited

U.S. PATENT DOCUMENTS

| | | | |
|---|---|---|---|
| 6,797,109 B2 | 9/2004 | Park et al. | |
| 6,824,627 B2 | 11/2004 | Dhindsa et al. | |
| 7,244,336 B2 | 7/2007 | Fischer et al. | |

(Continued)

FOREIGN PATENT DOCUMENTS

| | | |
|---|---|---|
| JP | 2012-146742 A | 8/2012 |
| KR | 100292410 B1 | 6/2001 |

(Continued)

*Primary Examiner* — Kurt Sweely
(74) *Attorney, Agent, or Firm* — Muir Patent Law, PLLC

(57) ABSTRACT

Disclosed are focus rings, substrate processing apparatuses including the same, and substrate processing methods using the same. The focus ring comprises a first ring formed around an axis that extends in a first direction and a second ring separate from the first ring and formed around the axis. A portion of an inner lateral surface of the second ring is in contact with a portion of an outer lateral surface of the first ring. When viewed from a cross-sectional view from a direction perpendicular to the axis, a first angle between the outer lateral surface and the first direction is different from a second angle between the inner lateral surface and the first direction.

19 Claims, 20 Drawing Sheets

(58) Field of Classification Search
CPC .... H10P 72/72; H10P 72/722; H10P 72/7612;
H10P 72/7624
See application file for complete search history.

(56) References Cited

U.S. PATENT DOCUMENTS

| | | | |
|---|---|---|---|
| 7,837,827 B2 | 11/2010 | Dhindsa et al. | |
| 8,084,375 B2 | 12/2011 | Koshiishi et al. | |
| 8,622,021 B2 | 1/2014 | Taylor et al. | |
| 9,011,637 B2 | 4/2015 | Yamamoto | |
| 10,283,330 B2 | 5/2019 | Marakhtanov et al. | |
| 10,777,392 B2 | 9/2020 | Yamawaku et al. | |
| 11,393,710 B2 | 7/2022 | Rice et al. | |
| 2005/0005859 A1* | 1/2005 | Koshiishi .......... | H01J 37/32642 |
| | | | 118/728 |
| 2008/0236749 A1 | 10/2008 | Koshimizu et al. | |
| 2010/0213171 A1* | 8/2010 | Koshimizu ....... | H01J 37/32522 |
| | | | 156/345.37 |
| 2010/0243606 A1* | 9/2010 | Koshimizu ....... | H01J 37/32091 |
| | | | 156/345.44 |
| 2012/0175063 A1* | 7/2012 | Yamawaku ....... | H01L 21/67069 |
| | | | 156/345.46 |
| 2014/0034242 A1 | 2/2014 | Sant et al. | |
| 2018/0358211 A1* | 12/2018 | Mun ................... | H01L 21/6831 |
| 2019/0066983 A1* | 2/2019 | Sung ................... | H01L 21/6719 |
| 2020/0098550 A1* | 3/2020 | Takahashi ......... | H01L 21/68742 |
| 2021/0202217 A1* | 7/2021 | Lim ................... | C23C 16/4585 |

FOREIGN PATENT DOCUMENTS

| | | | |
|---|---|---|---|
| KR | 101118003 B1 | | 2/2012 |
| KR | 101645043 B1 | | 8/2016 |
| KR | 10-2018-0076311 A | | 7/2018 |
| KR | 10-2018-0099776 A | | 9/2018 |
| KR | 10-1927936 B1 | | 12/2018 |
| KR | 10-2019-0068490 A | | 6/2019 |

* cited by examiner

FIG. 12

FOCUS RING AND SUBSTRATE PROCESSING APPARATUS INCLUDING THE SAME

CROSS-REFERENCE TO RELATED APPLICATION

This U.S. nonprovisional application claims priority under 35 U.S.C § 119 to Korean Patent Application No. 10-2021-0153266 filed on Nov. 9, 2021 in the Korean Intellectual Property Office, the disclosure of which is hereby incorporated by reference in its entirety.

BACKGROUND

The present inventive concepts relate to a focus ring, a substrate processing apparatus including the same, and a substrate processing method using the same, and more particularly, to a focus ring capable of controlling a plasma distribution, a substrate processing apparatus including the same, and a substrate processing method using the same.

A semiconductor device may be fabricated through various processes. For example, the semiconductor device may be manufactured by a photolithography process, an etching process, and a deposition process performed on a silicon wafer. An etching process may use plasma to fabricate the semiconductor device. A focus ring may be adopted to control a plasma distribution in a wafer etching process in which the plasma is used.

SUMMARY

Some embodiments of the present inventive concepts provide a focus ring capable of independently controlling plasma on an edge region, a substrate processing apparatus including the same, and a substrate processing method using the same.

Some embodiments of the present inventive concepts provide a focus ring whose portion is capable of being replaced automatically and promptly, a substrate processing apparatus including the same, and a substrate processing method using the same.

Some embodiments of the present inventive concepts provide a focus ring whose temperature is reduced to increase a substrate etching yield, a substrate processing apparatus including the same, and a substrate processing method using the same.

The objectives of the present inventive concepts are not limited to the ones mentioned above, and other objectives which have not been mentioned above will be clearly understood to those skilled in the art from the following description.

According to some embodiments of the present inventive concepts, A focus ring for a substrate processing apparatus includes a first ring and a second ring. The first ring is formed around an axis that extends in a first direction, and the second ring is separate from the first ring and formed around the axis. A first portion of an inner lateral surface of the second ring, which inner lateral surface faces the axis, contacts a first portion of an outer lateral surface of the first ring, which outer lateral surface faces away from the axis, and a second portion of the inner lateral surface of the second ring does not contact the outer lateral surface of the first ring. When viewed from a cross-sectional view from a direction perpendicular to the axis, a first angle between the outer lateral surface and the first direction is different from a second angle between the inner lateral surface and the first direction According to some embodiments of the present inventive concepts, a substrate processing apparatus may comprise: an electrostatic chuck; a focus ring on the electrostatic chuck; and an outer ring that surrounds the focus ring. The focus ring may include: a first ring; and a second ring. The first ring may include: a first ring body; and a protrusion member that extends outwardly from the first ring body. A top-most surface of the protrusion member may be at a vertical level lower than a vertical level of a top-most surface of the first ring body. A portion of the second ring may be on the protrusion member. Another portion of the second ring may be on the outer ring. A bottom surface of the second ring may be vertically spaced apart from and not in contact with the top-most surface of the protrusion member to form a gap between the second ring and the protrusion member.

According to some embodiments of the present inventive concepts, a substrate processing apparatus may comprise: an electrostatic chuck; a focus ring on the electrostatic chuck; and a ring lift pin that extends in a first direction. The focus ring may include: a first ring formed around an axis that is parallel to the first direction; and a second ring not affixed to the first ring, and of which at least a portion is positioned outwardly from the first ring, with respect to the axis. The ring lift pin may be disposed below the second ring.

According to some embodiments of the present inventive concepts, a substrate processing method may comprise: placing a substrate in a focus ring on an electrostatic chuck; supplying a process gas into a process chamber in which the substrate is disposed; applying a first radio-frequency power to a plasma electrode of the electrostatic chuck; removing the substrate from the electrostatic chuck; and replacing a portion of the focus ring in a state in which the substrate is removed from the process chamber. The focus ring may include: a first ring; and a second ring contacting the first ring, at least a portion of the second ring protruding outwardly from the first ring. A heat transfer pad may be between the first ring and the electrostatic chuck. The heat transfer pad may contact a bottom surface of the first ring and a top surface of the electrostatic chuck. The step of replacing the portion of the focus ring may include replacing the second ring by separating the second ring from the first ring.

Details of other example embodiments are included in the description and drawings.

BRIEF DESCRIPTION OF THE DRAWINGS

FIGS. 9 to 16 illustrate cross-sectional views showing a substrate processing method according to the flow chart of FIG. 8.

DETAIL PARTED DESCRIPTION OF EMBODIMENTS

Figure 1:
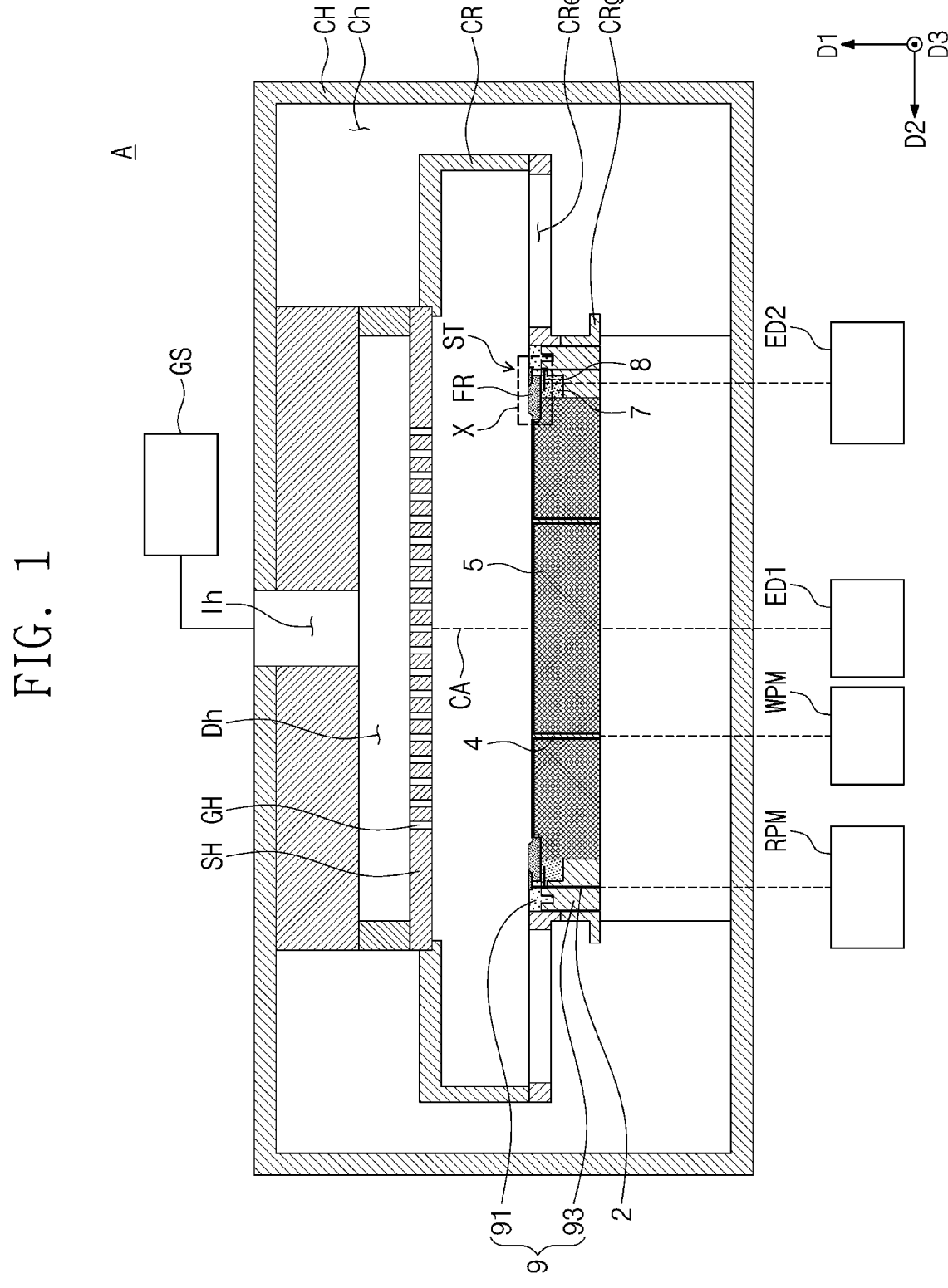
FIG. 1 illustrates a cross-sectional view showing a substrate processing apparatus according to some embodiments of the present inventive concepts.

The following will now describe some embodiments of the present inventive concepts with reference to the accompanying drawings. Like reference numerals may indicate like components throughout the description.

FIG. 1 illustrates a cross-sectional view showing a substrate processing apparatus according to some embodiments of the present inventive concepts.

In this description, symbol D1 may indicate a first direction, symbol D2 may indicate a second direction that intersects the first direction D1, and symbol D3 may indicate a third direction that intersects each of the first and second directions D1 and D2. The first direction D1 toward a top of FIG. 1 may be called an upward direction, and the first direction D1 reverse to the upward direction may be called a downward direction. Alternatively, the first direction D1 may be called a vertical direction. In addition, each of the second and third directions D2 and D3 may be called a horizontal direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIG. 1, a substrate processing apparatus A is provided. The substrate processing apparatus A may be a substrate etching apparatus. For example, the substrate processing apparatus A may be configured to use plasma to etch one surface of a substrate. The substrate processing apparatus A may use various ways to generate the plasma. For example, the substrate processing apparatus A may generate the plasma by using a capacitively coupled plasma (CCP) mode, an inductively coupled plasma (ICP) mode, or a magnetically enhanced reactive ion etching (MERIE) mode. The present inventive concepts, however, are not limited thereto, and the substrate processing apparatus A may be configured to use other ways to etch the substrate. For convenience, the following will describe the substrate processing apparatus A operated in the capacitively coupled plasma (CCP) mode.

The substrate processing apparatus A may include a process chamber CH, a gas supply GS, a shower head SH, a confinement ring CR, a stage ST, ring lift pin driver RPM, a substrate lift pin driver WPM, a first radio-frequency power supply ED1, and a second radio-frequency power supply ED2.

The process chamber CH may provide a process space Ch. The process chamber CH may also be described as a process chamber housing, and the process space Ch may also be described as the chamber space. The stage ST may be positioned in the process space Ch. A substrate may be disposed on the stage ST in the process chamber CH. An etching process may be performed on the substrate in a state where the stage ST is located in the process space Ch.

The gas supply GS may be connected to the process chamber CH. For example, the gas supply GS may be connected by a gas supply line through a gas inlet Ih to the process space Ch. The gas supply GS may provide a process gas which forms the plasma. The gas supply GS may include, for example, a gas tank and a compressor.

The shower head SH may be coupled to an upper side of the process chamber CH. A distribution space Dh may be provided on the shower head SH. The distribution space Dh may be connected through the gas inlet Ih to the gas supply GS. The shower head SH may provide a distribution hole GH (e.g., a plurality of distribution holes GH). A process gas provided from the gas supply GS may move through the distribution holes GH toward the stage ST. The shower head SH may have a flat shape at a bottom surface thereof, but the present inventive concepts are not limited thereto. For example, unlike that shown in FIG. 1, the shower head SH may have an unevenly curved shape at the bottom surface thereof.

The confinement ring CR may surround a space between the shower head SH and the stage ST. The confinement ring CR may provide a slit CRe, more generally described as an opening. A fluid on the stage ST may be downwardly discharged through the slit CRe. The confinement ring CR may be electrically grounded through a confinement-ring ground member CRg.

The stage ST may be positioned in the process chamber CH. A substrate may be disposed on the stage ST. The stage ST may include an electrostatic chuck 5, a focus ring FR, a coupling ring 7, an outer electrode 8, an outer ring 9, a substrate lift pin 4, and a ring lift pin 2.

The electrostatic chuck 5 may support and/or fix the substrate. For example, when the substrate is disposed on the electrostatic chuck 5, the electrostatic chuck 5 may use an electrostatic force to place the substrate onto a certain location. The electrostatic chuck 5 will be further discussed in detail below.

The focus ring FR may surround the substrate disposed on the electrostatic chuck 5. The focus ring FR may be a rotationally symmetric body formed around an axis CA. The present inventive concepts, however, are not limited thereto. The axis CA of the focus ring FR may extend in the first direction D1. The focus ring FR may include or be formed of one or more of silicon (Si) and silicon carbide (SiC). The focus ring RF may have a closed-loop, circular form. The present inventive concepts, however, are not limited thereto, and, for example, the focus ring FR may include or be formed of a material other than the silicon (Si) and silicon carbide (SiC). The focus ring FR may be divided into two or more members. Two or more members of the focus ring FR may include different materials from each other. A detailed description thereof will be further discussed below.

The coupling ring 7 may be positioned beneath the focus ring FR. The coupling ring 7 may surround the electrostatic chuck 5. For example, when viewed in plan, the coupling ring 7 may outwardly surround the electrostatic chuck 5. The coupling ring 7 may include or be formed of alumina (Al$_2$O$_3$). The coupling ring may also be described as a connecting ring, or a support ring.

The outer electrode 8 may be positioned beneath the focus ring FR. For example, the outer electrode 8 may be positioned in the coupling ring 7. The outer electrode 8 may include or be formed of one or more of tungsten (W) and platinum (Pt). The outer electrode 8 may be electrically connected to the second RF power supply ED2. The outer electrode 8 may receive a radio-frequency power from the second RF power supply ED2.

The outer ring 9 may surround the electrostatic chuck 5, and may be formed, for example, at the same vertical level in the D1 direction as the electrostatic chuck 5. The outer ring 9 may include a quartz ring 91 and a ground ring 93. The quartz ring 91 may surround the focus ring FR. The quartz ring 91 may be positioned on the ground ring 93. The ground ring 93 may surround the coupling ring 7.

The substrate lift pin 4 may extend in the first direction D1. The substrate lift pin 4 may vertically penetrate the electrostatic chuck 5. The substrate lift pin 4 may be vertically driven by the substrate lift pin driver WPM. The substrate lift pin 4 may vertically move to load or unload the substrate on or from the electrostatic chuck 5. The substrate lift pin 4 may be provided in plural. For example, three substrate lift pins 4 may be provided. A plurality of substrate lift pins 4 may be disposed spaced apart from each other in a horizontal direction. For convenience, the following will describe a single substrate lift pin 4.

The ring lift pin 2 may extend in the first direction D1. The ring lift pin 2 may be positioned outside the electrostatic chuck 5. The ring lift pin 2 may vertically penetrate at least a portion of the outer ring 9. The ring lift pin 2 may be vertically driven by the ring lift pin driver RPM. The ring lift pin 2 may vertically move to load or unloading a portion of the focus ring FR. The ring lift pin 2 may be provided in plural. For example, three ring lift pins 2 may be provided. A plurality of ring lift pins 2 may be disposed spaced apart from each other in a horizontal direction. For convenience, the following will describe a single ring lift pin 2.

The ring lift pin driver RPM may drive the ring lift pin 2 to move vertically. The ring lift pin driver RPM may include an actuator, such as one or more of an electric motor and a hydraulic motor.

The substrate lift pin driver WPM may drive the substrate lift pin 4 to move vertically. The substrate lift pin driver WPM may include an actuator, such as one or more of an electric motor and a hydraulic motor.

The first RF power supply ED1 may be electrically connected to the electrostatic chuck 5. The first RF power supply ED1 may transfer a first radio-frequency power to the electrostatic chuck 5.

The second RF power supply ED2 may be electrically connected to the outer electrode 8. The second RF power supply ED2 may transfer a second radio-frequency power to the outer electrode 8. The second RF power may be distinguished from the first RF power.

Figure 2:
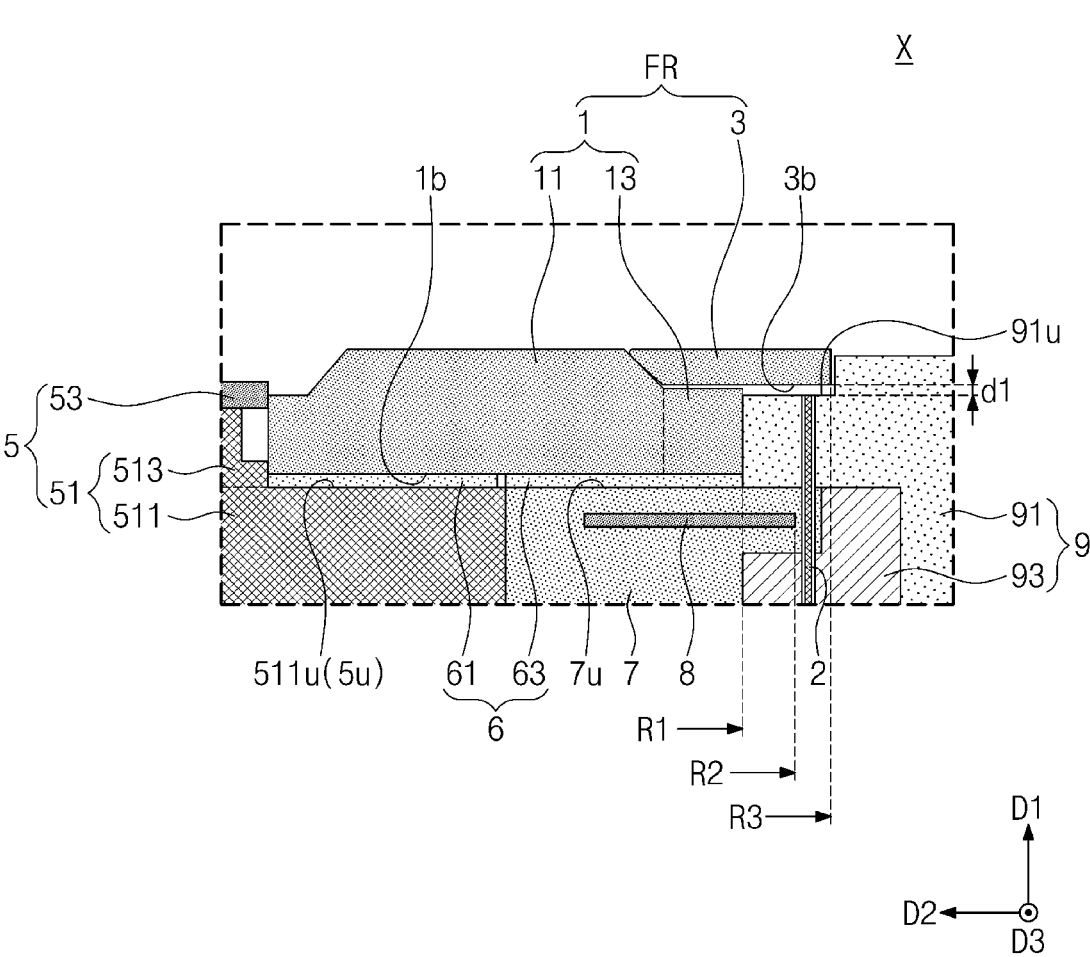
FIG. 2 illustrates an enlarged cross-sectional view showing section X of FIG. 1.

FIG. 2 illustrates an enlarged cross-sectional view showing section X of FIG. 1.

Referring to FIG. 2, the electrostatic chuck 5 may include a plasma electrode 51 and a chuck 53.

The plasma electrode 51 may support the chuck 53. The plasma electrode 51 may be connected to the first RF power supply ED1. The plasma electrode 51 may receive the first RF power from the first RF power supply ED1. The plasma electrode 51 may include or be formed of a conductive material. For example, the plasma electrode 51 may be formed of aluminum (Al). When the substrate processing apparatus (see A of FIG. 1) is a capacitively coupled plasma (CCP) apparatus, the plasma electrode 51 may be a bottom electrode. In this case, the shower head (see SH of FIG. 1) may be a top electrode. The plasma electrode 51 may include an electrode body 511 and a plateau 513. The electrode body 511 may have a cylindrical shape. The electrode body 511 may support a portion of the focus ring FR. The plateau 513 may be positioned on the electrode body 511. The plateau 513 may have a diameter less than that of the electrode body 511. Therefore, a top surface 511*u* of the electrode body 511 may be exposed outside the plateau 513.

The chuck 53 may be positioned on the plasma electrode 51. The chuck 53 may support and fix the substrate. The chuck 53 may be provided on its top surface with a plurality of burl structures for supporting the substrate. The chuck 53 may include or may be a chuck electrode and in some embodiments, may be formed of a metal. The chuck electrode may use an electrostatic force to rigidly place the substrate on a certain location on the chuck 53.

The focus ring FR may be positioned on the electrostatic chuck 5. For example, the focus ring FR may be positioned on a top surface 5*u* of the electrostatic chuck 5 and a top surface 7*u* of the coupling ring 7. The top surface 5*u* of the electrostatic chuck 5 may correspond to the top surface 511*u* of the electrode body 511. The focus ring FR may include a plurality of members, or a plurality of parts or portions. For example, the focus ring FR may include a first ring 1 and a second ring 3.

The first ring 1 may be a rotating body having the axis (see CA of FIG. 1). The first ring 1 may be positioned on the electrode body 511 and a coupling ring 7. The first ring 1 may have a bottom surface 1*b* positioned on the top surface 511*u* of the electrode body 511 and the top surface 7*u* of the coupling ring 7. The bottom surface 1*b* of the first ring 1 may be upwardly spaced apart from each of the top surface 511*u* of the electrode body 511 and the top surface 7*u* of the coupling ring 7. In this case, a heat transfer pad 6, also described as a heat transfer layer, may be positioned beneath the first ring 1. For example, a first heat transfer pad 61 may be positioned between the first ring 1 and the electrode body 511.

In one embodiment, the first heat transfer pad 61 contacts the bottom surface 1*b* of the first ring 1 and the top surface 511*u* of the electrode body 511. The first heat transfer pad 61 may fix the first ring 1 to the electrode body 511. For example, the first heat transfer pad 61 may have an adhesive function, and may be referred to herein as an adhesive or an adhesive layer. A second heat transfer pad 63 may be positioned between the first ring 1 and the coupling ring 7. In one embodiment, the second heat transfer pad 63 contacts the bottom surface 1*b* of the first ring 1 and the top surface 7*u* of the coupling ring 7. The second heat transfer pad 63 may fix the first ring 1 to the coupling ring 7. For example, the second heat transfer pad 63 may have an adhesive function, and may be referred to herein as an adhesive or an adhesive layer. The first and second heat transfer pads 61 and 63 may be spaced apart from each other in a horizontal direction. Alternatively, differently from that shown, the first and second heat transfer pads 61 and 63 may be connected to each other, e.g., to contact each other. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The heat transfer pad 6 may include or be formed of a silicon-based material. The heat transfer pad 6 may include carbon nano-tubes and/or fillers such as aluminum (Al). The present inventive concepts, however, are not limited thereto, and the heat transfer pad 6 may not be provided. In this case, the bottom surface 1*b* of the first ring 1 may contact the top surface 511*u* of the electrode body 511 and the top surface 7*u* of the coupling ring 7. The first ring 1 may include a first ring body 11 and a protrusion member 13 (also described simply as a protrusion or protruding structure). The protrusion member 13 may be a protruding component that extends outwardly from the first ring body 11. A top surface of the protrusion member 13 may be located at a lower vertical level than the top surface of the first ring body 11. A detailed description of the first ring body 11 and the protrusion member 13 will be discussed below with reference to FIGS. 3 to 7.

The second ring 3 may be connected to the first ring 1. For example, the second ring 3 may be positioned on the first ring 1. For another example, the second ring 3 may be connected to an outside of the first ring 1. The second ring 3 may contact the first ring 1. For example, the second ring 3 may be in linear contact with the first ring 1. The linear contact between the first ring 1 and the second ring 3 may form a circle when viewed in plan. For example, the second ring 3 and the first ring body 11 may be in linear contact with each other to form a circle. A portion of the second ring 3 may be positioned on the protrusion member 13. The second ring 3 may not contact the protrusion member 13. For example, the second ring 3 may be upwardly spaced apart from the protrusion member 13. A detailed description thereof will be further discussed below. Another portion of the second ring 3 may be positioned on the outer ring 9. For example, another portion of the second ring 3 may be positioned on the quartz ring 91. The second ring 3 may be upwardly spaced apart from the quartz ring 91. For example, the second ring 3 may have a bottom surface 3*b* that is upwardly spaced apart at a first distance d1 from a top surface 91*u* of the quartz ring 91. The first distance d1 may range from about 0.1 mm to about 0.5 mm. For example, the first distance d1 may be about 0.3 mm. In this case, the second ring 3 may be in linear contact with the first ring body 11, but may not be in contact with any component. The present inventive concepts, however, are not limited thereto, and the bottom surface 3*b* of the second ring 3 may be in contact with the top surface 91*u* of the quartz ring 91. A detailed description of the first and second rings 1 and 3 will be further discussed below with reference to FIGS. 3 to 7.

The ring lift pin 2 may be positioned beneath the second ring 3. The ring lift pin 2 may be positioned outside the outer electrode 8. For example, when viewed in plan, the ring lift pin 2 may not overlap the outer electrode 8. The ring lift pin 2 may be positioned outside the first ring 1. For example, when viewed in a plan view, the ring lift pin 2 may not overlap the first ring 1. The ring lift pin 2 may vertically penetrate the ground ring 93. The ring lift pin 2 may vertically penetrate the coupling ring 7. The coupling ring 7 may be provided therein with a pin insertion hole (not designated by a reference numeral) that vertically penetrates the coupling ring 7. The ring lift pin 2 may be inserted into the pin insertion hole. In addition, the ring lift pin 2 may vertically penetrate the quartz ring 91. The quartz ring 91 may be provided therein with a second pin insertion hole (not designated by a reference numeral) that vertically penetrates the quartz ring 91. The ring lift pin 2 may be inserted into the second pin insertion hole. The ring lift pin 2 may be exposed on the top surface 91*u* of the quartz ring

91. The present inventive concepts, however, are not limited thereto, and when viewed in a plan view, the ring lift pin 2 may overlap the first ring 1. In this case, the ring lift pin 2 may vertically penetrate the first ring 1. A detailed description thereof will be further discussed below with reference to FIG. 27. The ring lift pin 2 may have an elongated linear vertical shape.

A first outer diameter R1 indicates a diameter of an outer side surface or outer edge the first ring 1. A second outer diameter R2 indicates a diameter of an outer edge of outer electrode 8. A third outer diameter R3 indicates a diameter of an outer side surface or outer edge of the second ring 3. The second outer diameter R2 may be greater the first outer diameter R1. Therefore, when viewed in a plan view, the outer electrode 8 may outwardly protrude from the first ring 1. In addition, the second outer diameter R2 may be less than the third outer diameter R3. Therefore, in the embodiment of FIG. 2, when viewed in a plan view, the outer electrode 8 does not outwardly protrude from the second ring 3. A portion of the second ring 3 overhangs the outer electrode 8.

The coupling ring 7 may be positioned beneath the first ring 1. At least a portion of the coupling ring 7 may outwardly protrude from the first ring 1. Therefore, at least a portion of the coupling ring 7 may be positioned beneath the second ring 3 that outwardly protrudes from the protrusion member 13. The coupling ring 7 may have an outer diameter substantially the same as or similar to the third outer diameter R3, but the present inventive concepts are not limited thereto. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 3:
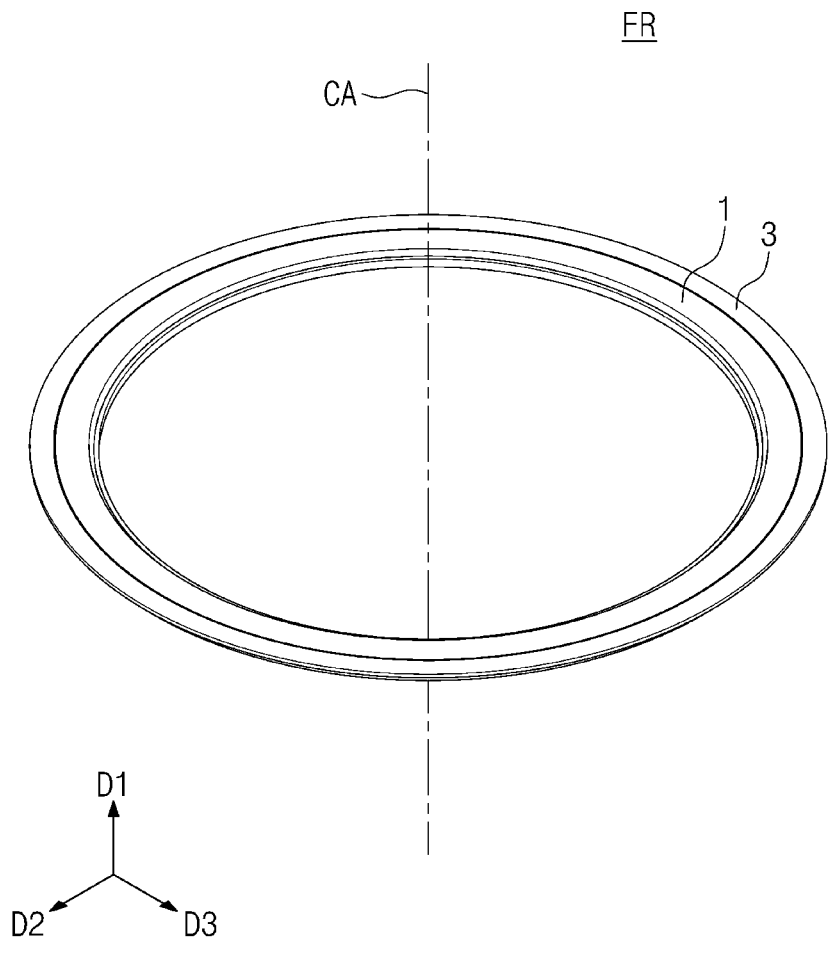
FIG. 3 illustrates a perspective view showing a focus ring according to some embodiments of the present inventive concepts.
Figure 4:
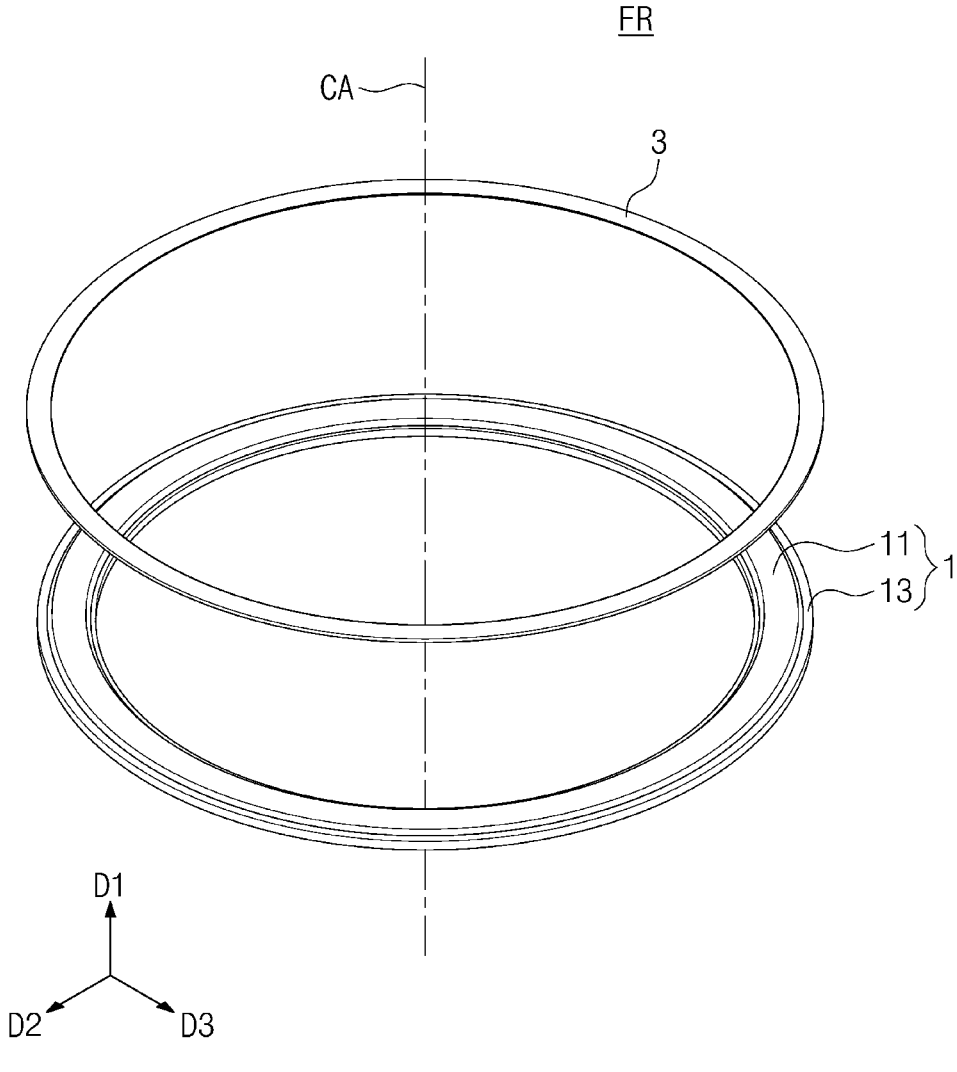
FIG. 4 illustrates an exploded perspective view showing a focus ring according to some embodiments of the present inventive concepts.
Figure 5:
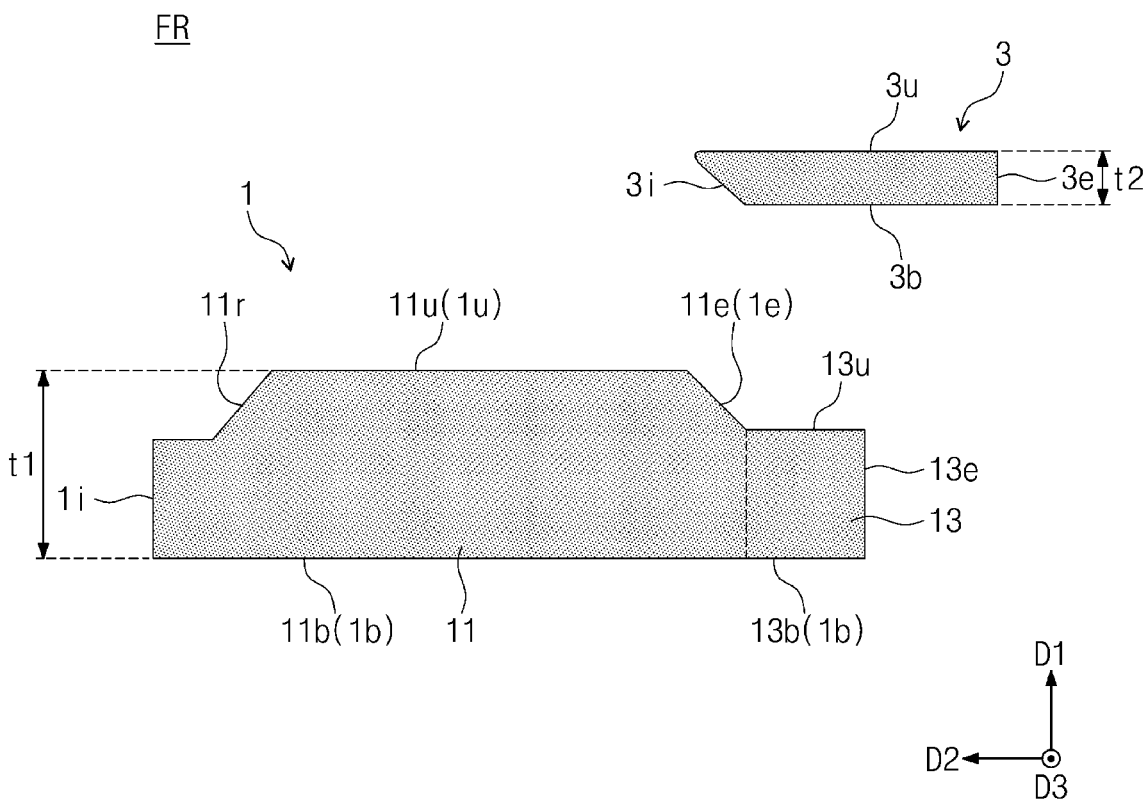
FIG. 5 illustrates an exploded perspective view showing a focus ring according to some embodiments of the present inventive concepts.
Figure 6A:
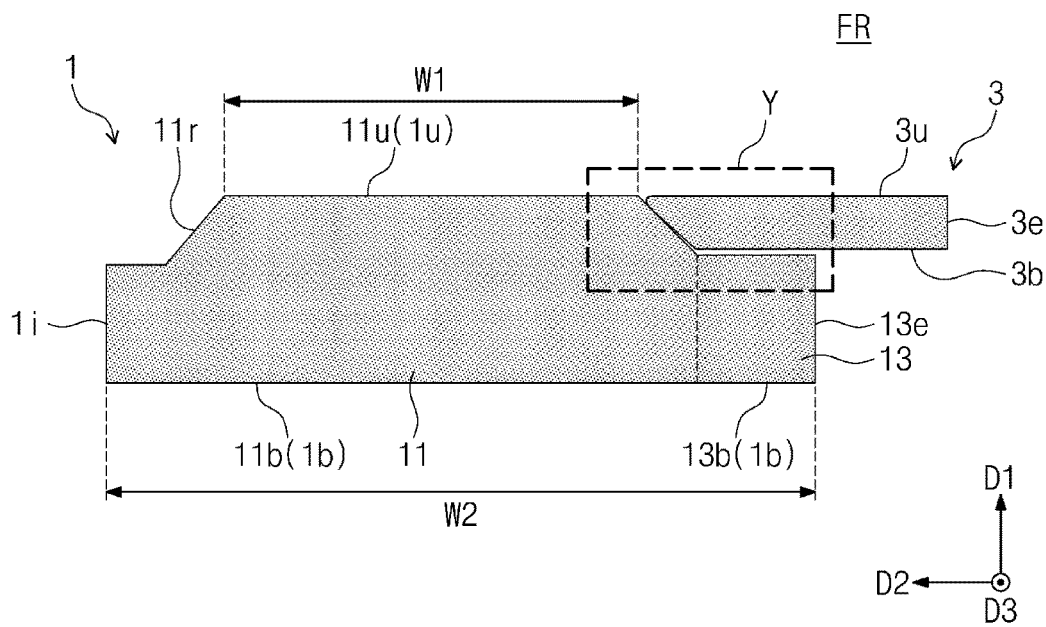
FIG. 6A illustrates a cross-sectional view showing a focus ring according to some embodiments of the present inventive concepts.
Figure 6B:
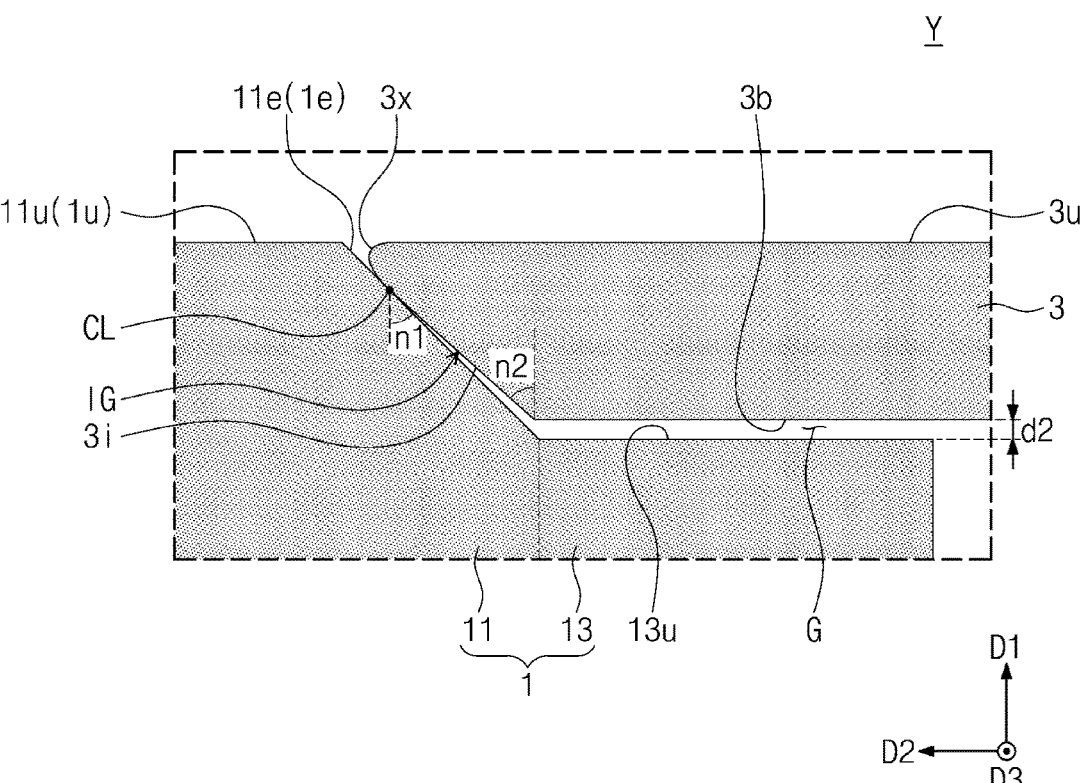
FIG. 6B illustrates an enlarged cross-sectional view showing section Y of FIG. 6A.

FIG. 3 illustrates a perspective view showing a focus ring according to some embodiments of the present inventive concepts. FIG. 4 illustrates an exploded perspective view showing a focus ring according to some embodiments of the present inventive concepts. FIG. 5 illustrates an exploded perspective view showing a focus ring according to some embodiments of the present inventive concepts. FIG. 6A illustrates a cross-sectional view showing a focus ring according to some embodiments of the present inventive concepts. FIG. 6B illustrates an enlarged cross-sectional view showing section Y of FIG. 6A.

Referring to FIG. 5 together with FIGS. 3 and 4, the first ring 1 may have an inner lateral surface 1*i* oriented toward the axis (e.g., that faces the axis; see CA of FIG. 3, which may be a central radial axis). The inner lateral surface 1*i* of the first ring 1 may define a space through which the axis CA passes. The first ring body 11 may also have a top surface, which includes top-most surface 11*u*, as well as recess surface 11*r* and outer lateral surface 11*e* of the first ring body.

A first thickness t1 may indicate a thickness of the first ring body 11. The first thickness t1 may mean a vertical distance between the top-most and bottom-most surfaces 11*u* and 11*b* of the first ring body 11, and may correspond to a maximum thickness of the first ring body 11 in the vertical direction. The first thickness t1 may be in a range from about 4.5 mm to about 8.5 mm. For example, the first thickness t1 may be about 6.5 mm. The first ring body 11 may have a top surface including a portion that is downwardly recessed. For example, an inner portion of the top surface of the first ring body 11 may be downward recessed to form a recess surface 11$r$. The recess surface 11$r$ may form a recess at an inside of the first ring body 11.

The protrusion member 13 may have a bottom surface 13$b$ (e.g., bottom-most surface) located at substantially the same level as that of the bottom surface 11$b$ (e.g., bottom-most surface) of the first ring body 11. The protrusion member 13 may have an outer lateral surface 13$e$ that stands opposite to the inner lateral surface 1$i$ of the first ring 1, oriented away from (e.g., that faces away from) the axis CA. The protrusion member 13 may have a top surface 13$u$ (e.g., top-most surface) located at a lower level than that of the top-most surface 11$u$ of the first ring body 11. In addition, the top surface 13$u$ of the protrusion member 13 may be positioned lower than the outer lateral surface 11$e$ of the first ring body 11. In some embodiments, the protrusion member 13 may be omitted. The outer lateral surface 11$e$ of the first ring body 11 may correspond to an outer lateral surface 1$e$ of the first ring 1. In this description, the outer lateral surface 11$e$ of the first ring body 11 may be called the outer lateral surface 1$e$ of the first ring 1.

A second thickness t2 may indicate a thickness of the second ring 3. The second thickness t2 may mean a vertical distance between top and bottom surfaces 3$u$ and 3$b$ (e.g., top-most and bottom-most surfaces) of the second ring 3. The second thickness t2 may be in a range from about 1 mm to about 3 mm. For example, the second thickness t2 may be about 2 mm. The second ring 3 may have an inner lateral surface 3$i$ that is not parallel to the first direction D1. The second ring 3 may have an outer lateral surface 3$e$ that stands opposite to the inner lateral surface 3$i$ of the second ring 3. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Referring to FIG. 6A together with FIGS. 3 and 4, the second ring 3 may rest on the first ring 1. For example, the second ring 3 may be disposed on the protrusion member 13. The second ring 3 may not contact the protrusion member 13.

A first width w1 may indicate a width at a top surface 1$u$ (e.g., top-most surface) of the first ring 1 (e.g., a maximum width in the second direction D2). A second width w2 may indicate a width at the bottom surface 1$b$ (e.g., bottom-most surface) of the first ring 1 (e.g., a maximum width in the second direction D2). The second width w2 may be greater than the first width w1.

Referring to FIG. 6B together with FIGS. 3 and 4, the outer lateral surface 1$e$ of the first ring 1 may not be parallel to the first direction D1. For example, a first angle n1, which is not 0°, may be given as an angle between the first direction D1 and the outer lateral surface 1$e$ of the first ring 1. The angle may refer to an angle between a straight portion of the outer lateral side surface 1$e$ of the first ring 1 that does not contact the inner lateral side surface 3$i$ of the second ring 3, and the first direction D1. The outer lateral surface 1$e$ of the first ring 1 may be a portion of a lateral surface of a conical shape that is radially symmetrical about an axis (see CA of FIG. 3). The angle between the first direction D1 and the outer lateral surface 1$e$ of the first ring 1 may mean an angle provided between the first direction D1 and the outer lateral surface 1$e$ of the first ring 1 that is positioned on a plane taken parallel to the first direction D1. For example, the first angle n1 may be an acute angle among angles made between the first direction D1 and the outer lateral surface 1$e$ of the first ring 1 that is positioned on a plane that passes through the axis (see CA of FIG. 3). The first angle n1 may be an acute angle between the first direction D1 and a generating line of the outer lateral surface 1$e$ of the first ring 1. The outer lateral surface 1$e$ of the first ring 1 may slope downwardly and outwardly, and may have a flat shape when viewed in a cross section. The outer lateral surface 1$e$ of the first ring 1 may be connected to the top surface 11$u$ of the first ring body 11. For example, as illustrated in FIG. 6B, the outer lateral surface 1$e$ of the first ring 1 and the top surface 11$u$ (e.g., top-most surface) of the first ring body 11 may meet each other at a sharp angle when viewed in cross section. The present inventive concepts, however, are not limited thereto, and differently from that shown in FIG. 6B, the outer lateral surface 1$e$ of the first ring 1 and the top surface 11$u$ of the first ring body 11 may meet each other not at a sharp angle but at a rounded angle or edge when viewed in cross section. The outer lateral surface 1$e$ of the first ring 1 may be connected to the top surface 13$u$ of the protrusion member 13.

The inner lateral surface 3$i$ of the second ring 3 may not be parallel to the first direction D1. For example, a second angle n2, which is not 0°, may be given as an angle between the first direction D1 the inner lateral surface 3$i$ of the second ring 3. The angle may refer to an angle between a straight portion of the inner lateral side surface 3$i$ of the second ring 3 that does not contact the outer lateral side surface 1$e$ of the first ring 1, and the first direction D1. The inner lateral surface 3$i$ of the second ring 3 may be a portion of a lateral surface of a conical shape that is radially symmetrical about the axis (see CA of FIG. 3). The angle between the first direction D1 and the inner lateral surface 3$i$ of the second ring 3 may mean an angle provided between the first direction D1 and the inner lateral surface 3$i$ of the second ring 3 that is positioned on a plane taken parallel to the first direction D1. For example, the second angle n2 may mean an acute angle among angles made between the first direction D1 and the inner lateral surface 3$i$ of the second ring 3 that is positioned on a plane that passes through an axis (see CA of FIG. 3). The second angle n2 may be an acute angle between the first direction D1 and a generating line of the inner lateral surface 3$i$ of the second ring 3. The inner lateral surface 3$i$ of the second ring 3 may slope downwardly and outwardly. The inner lateral surface 3$i$ of the second ring 3 may be connected to the top surface 3$u$ of the second ring 3. For example, as illustrated in FIG. 6B, the inner lateral surface 3$i$ of the second ring 3 and the top surface 3$u$ of the second ring 3 may be connected to each other through a connection surface 3$x$. The connection surface 3$x$ may be a curved surface that connects the inner lateral surface 3$i$ of the second ring 3 to the top surface 3$u$ of the second ring 3. The connection surface 3$x$ may appear as a curved line on a plane parallel to the first direction D1. In some cases, the surface 3$i$ may be described as a straight portion of an inner lateral surface of the second ring 3, and the surface 3$x$ may be described as a curved portion of an inner lateral surface. The present inventive concepts, however, are not limited to the above example, and differently from that shown, the inner lateral surface 3$i$ of the second ring 3 may be directly connected to the top surface 3$u$ (e.g., top-most surface) of the second ring 3, or the curved surface may include or may alternatively be one or more angled portions. The inner lateral surface 3$i$ of the second ring 3 may be connected to the bottom surface 3$b$ of the second ring 3.

A portion of the inner lateral surface 3*i* of the second ring 3, or a portion of the connection surface 3*x*, may contact a portion of the outer lateral surface 1*e* of the first ring 1. In some cases, a portion of the inner lateral surface of the second ring 3 where the surface 3*i* meets the surface 3*x* contacts a portion of the outer lateral surface 1*e* of the first ring 1. In a case where the surface 3*x* is not used, in one embodiment, a portion of the inner lateral surface 3*i* of the second ring 3 where it connects to the top surface 3*u* of the second ring 3 contacts the outer lateral surface 1*e* of the first ring 1. When the first angle n1 and the second angle n2 are different from each other, as discussed above, the outer lateral surface 1*e* of the first ring 1 and the inner lateral surface 3*i* of the second ring 3 may be in linear contact with each other. The linear contact may refer to a contact line that forms a closed loop (e.g., circle) when viewed in a plan view. For example, when viewed in a cross section of the D1-D2 plane and passing through a radial center of the first ring 1 (or more generally, when viewed in a cross section view from a direction perpendicular to the axis CA), only a small portion of the length of the inner lateral surface 3*i* (or 3*i* combined with 3*x*) of the second ring 3 contacts the outer lateral surface 1*e* of the first ring 1. For example, this portion may be between about 0.1% and 3% of the total length of the surface as seen in the cross section, which may be considered a point contact, when viewed in the cross section, or a linear contact, when viewed in a perspective view or plan view. When the outer lateral surface 1*e* of the first ring 1 is steeper than the inner lateral surface 3*i* of the second ring 3, a space may be provided below a contact line CL between the outer lateral surface 1*e* of the first ring 1 and the inner lateral surface 3*i* of the second ring 3. For example, when the first angle n1 is less than the second angle n2, below the contact line CL, the inner lateral surface 3*i* of the second ring 3 may be upwardly and increasingly spaced apart from the outer lateral surface 1*e* of the first ring 1. Below the contact line CL, an inclination gap IG may be given as a space formed between the inner lateral surface 3*i* of the second ring 3 and the outer lateral surface 1*e* of the first ring 1. Spatially relative terms such as "above" and "below" as used herein have their ordinary broad meanings—for example element A can be above element B even if when looking down on the two elements there is no overlap between them (just as something in the sky is generally above something on the ground, even if it is not directly above).

The second ring 3 may not be in contact with the protrusion member 13. For example, the bottom surface 3*b* of the second ring 3 may be upwardly spaced apart from the top surface 13*u* of the protrusion member 13, and may not be in contact with the top surface 13*u* of the protrusion member 13. Therefore, a gap G may be formed between the bottom surface 3*b* of the second ring 3 and the top surface 13*u* of the protrusion member 13. The inclination gap IG and the gap G may be gaps in solid and/or non-gaseous material (e.g., may be air gaps filled only with air or other gasses). A second distance d2 may be given as an interval between the bottom surface 3*b* of the second ring 3 and the top surface 13*u* of the protrusion member 13. For example, a height of the gap G may correspond to the second distance d2. The second distance d2 may be in a range from about 0.05 mm to about 0.2 mm. For example, the second distance d2 may be about 0.1 mm. In some embodiments, the gap G may be spatially connected to the inclination gap IG. For example, the gap G may be connected to a lower portion of the inclination gap IG to form a continuous gap.

The outer lateral surface 1*e* of the first ring 1 and the inner lateral surface 3*i* of the second ring 3 are each illustrated as a straight line on a cross section taken along a plane that passes through the axis (see CA of FIG. 3), but the present inventive concepts are not limited thereto. For example, the outer lateral surface 1*e* of the first ring 1 may be curved (e.g., convexly curved) on the cross section of FIG. 6B. In this case, the first angle n1 may mean an acute angle made between the first direction D1 and an imaginary line that runs from the contact line CL to a point at which the outer lateral surface 1*e* of the first ring 1 meets the top surface 13*u* of the protrusion member 13. In addition, the inner lateral surface 3*i* of the second ring 3 may be curved (e.g., convexly curved) on the cross section of FIG. 6B. In this case, the second angle n2 may mean an acute angle made between the first direction D1 and an imaginary line that runs from the contact line CL to a point at which the inner lateral surface 3*i* of the second ring 3 meets the bottom surface 3*b* of the second ring 3. For an embodiment where the inner lateral surface 3*i* of the second ring 3 and/or the outer lateral surface 1*e* of the first ring 1 are convexly curved, the contact line CL may be formed at a portion where the inner lateral surface 3*i* of the second ring 3 contacts the outer lateral surface 1*e* of the first ring 1. In this case, the angles above may refer to an angle formed by a tangential line of the convex curve and the first direction D1.

Moreover, on a cross section taken along a plane that passes through the axis (see CA of FIG. 3), the inner lateral surface 3*i* of the second ring 3 may be continuously connected to the bottom surface 3*b* of the second ring 3. For example, differently from that shown in FIG. 6B, the inner lateral surface 3*i* of the second ring 3 and the bottom surface 3*b* of the second ring 3 may be connected to each other not in the form of an angle, but in the form of a curve. In this case, there may be no edge between the inner lateral surface 3*i* of the second ring 3 and the bottom surface 3*b* of the second ring 3. In some embodiments, the first ring 1 and second ring 3 may be formed of different materials. For example, the first ring 1 may be formed of silicon (Si), and the second ring 3 may be formed of silicon carbide (SiC). In other embodiments, the first ring 1 and second ring 3 may be formed of the same material (e.g., silicon (Si) or silicon carbide (SiC)).

Figure 7:
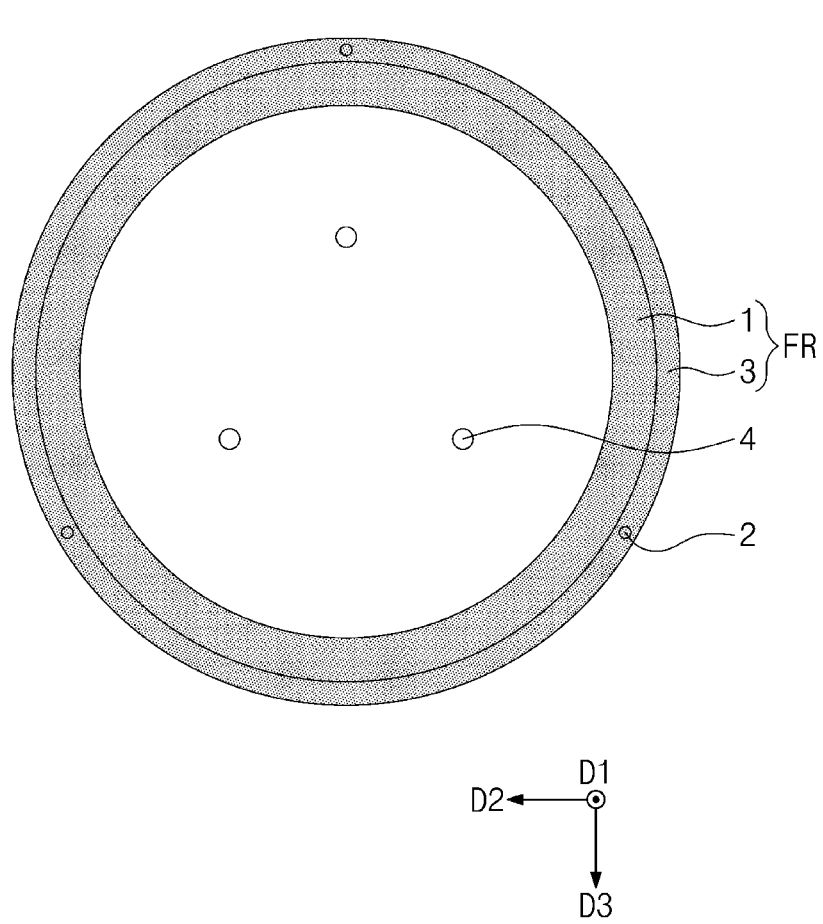
FIG. 7 illustrates a plan view showing a focus ring with which lift pins overlap according to some embodiments of the present inventive concepts.

FIG. 7 illustrates a plan view showing a focus ring with which lift pins overlap according to some embodiments of the present inventive concepts.

Referring to FIG. 7, three substrate lift pins 4 may be provided. When viewed in plan, the three substrate lift pins 4 may constitute three vertices of a triangle. In addition, three ring lift pins 2 may be provided. When viewed in plan, the three ring lift pins 2 may constitute three vertices of a triangle.

Figure 8:
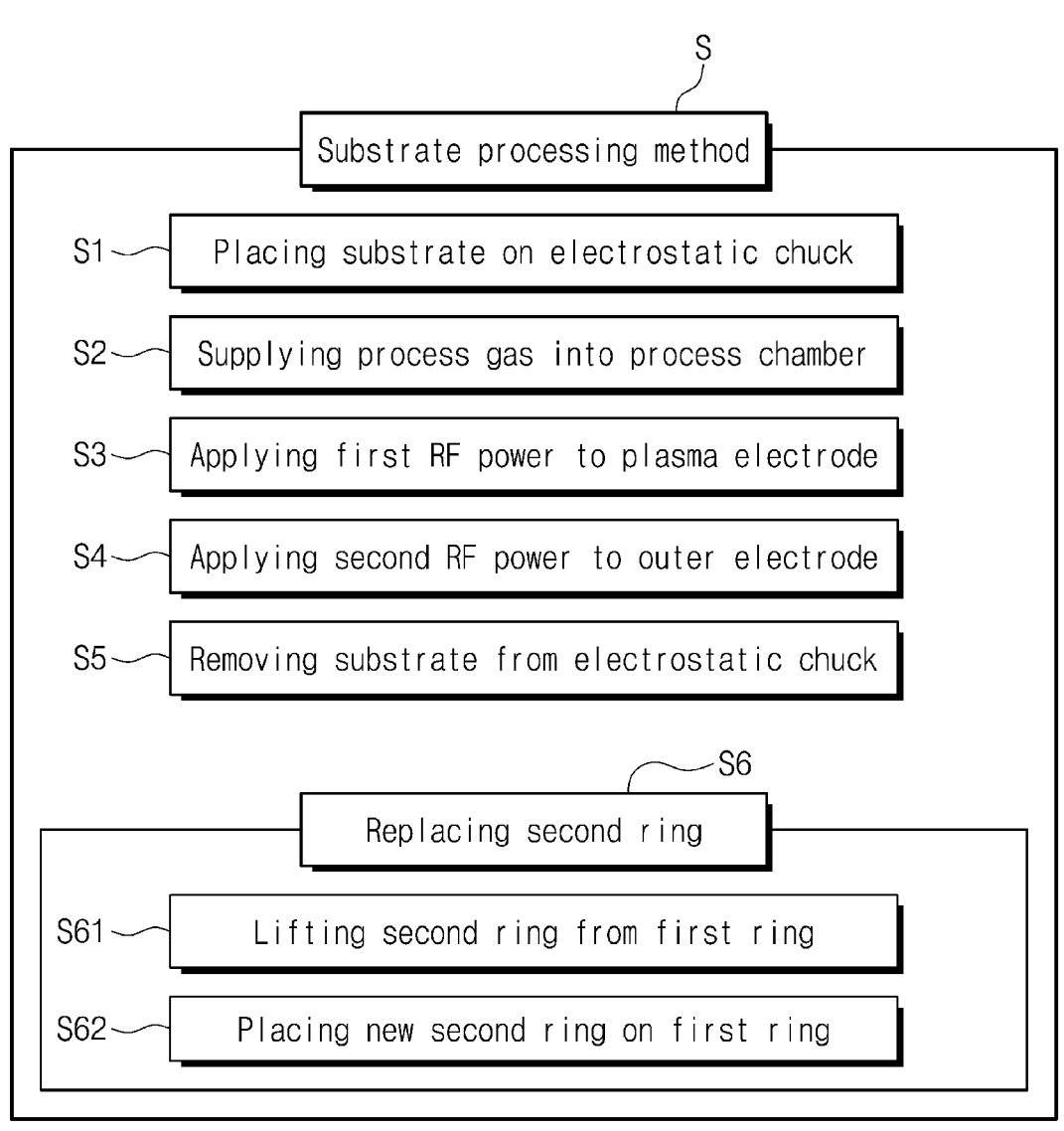
FIG. 8 illustrates a flow chart showing a substrate processing method according to some embodiments of the present inventive concepts.

FIG. 8 illustrates a flow chart showing a substrate processing method according to some embodiments of the present inventive concepts.

Referring to FIG. 8, a substrate processing method S may be provided. The substrate processing method S may mean a substrate treatment method using the substrate processing apparatus (see A of FIG. 1) discussed with reference to FIGS. 1 to 7. The substrate processing method S may include a step S1 of placing a substrate on an electrostatic chuck, a step S2 of supplying a process gas to a process chamber, a step S3 of applying a first RF power to a plasma electrode, a step S4 of applying a second RF power to an outer electrode, a step S5 of removing the substrate from the electrostatic chuck, and a step S6 of replacing a second ring.

The replacement step S6 may include a step S61 of lifting the second ring from a first ring and a step S62 of placing a second ring on the first ring.

With reference to FIGS. 9 to 16, the following will describe in detail the substrate processing method S of FIG. 8.

FIGS. 9 to 16 illustrate cross-sectional views showing a substrate processing method according to the flow chart of FIG. 8.

Figure 9:
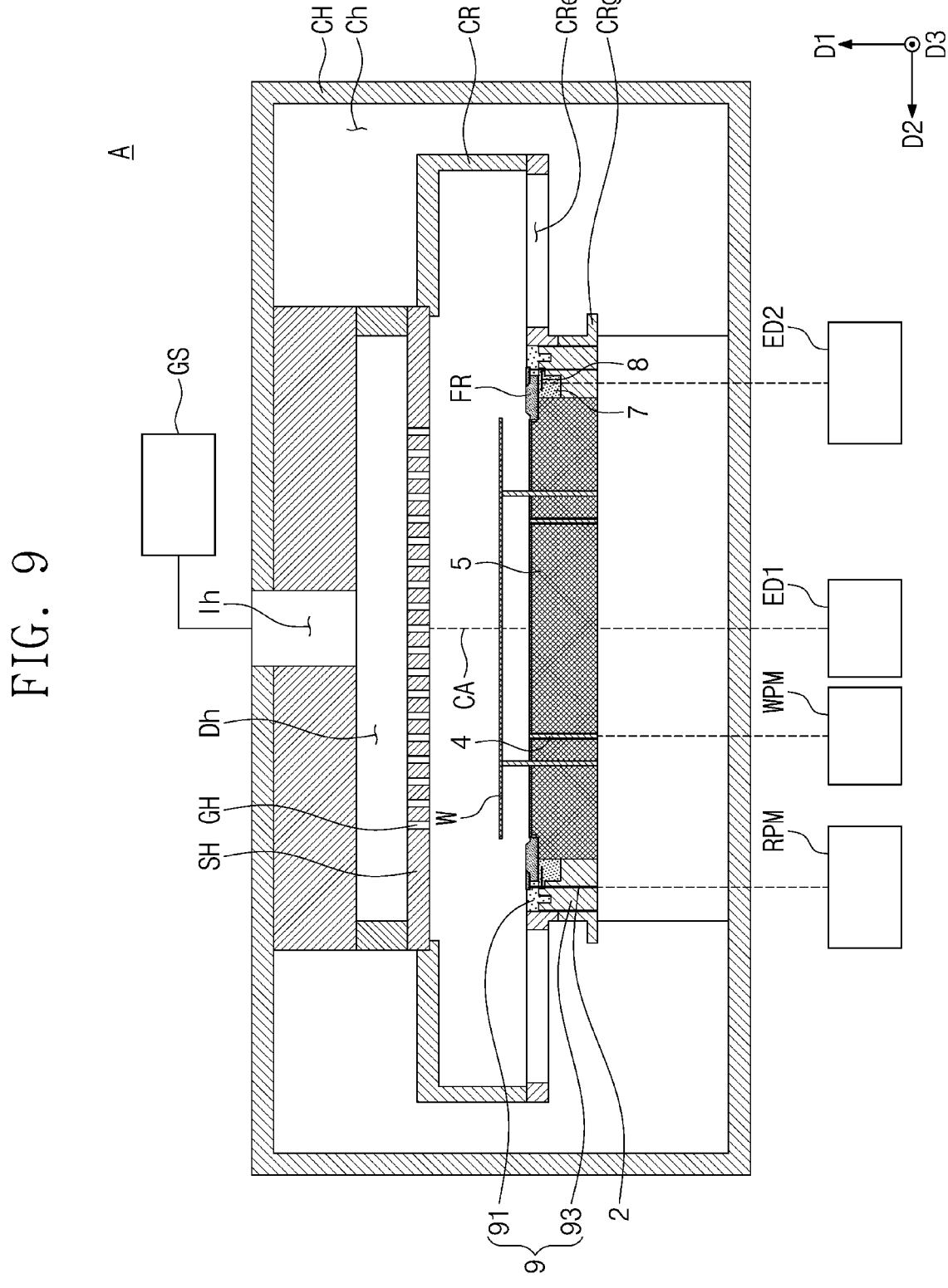

Referring to FIGS. 8 and 9, the substrate placement step S1 may include placing a substrate W on the substrate lift pin 4 that is raised by the substrate lift pin driver WPM. The substrate W may be a silicon wafer, but the present inventive concepts are not limited thereto. A robot arm (not shown) may load the substrate W into the process chamber CH. The robot arm may place the substrate W on the substrate lift pin 4.

Figure 10:
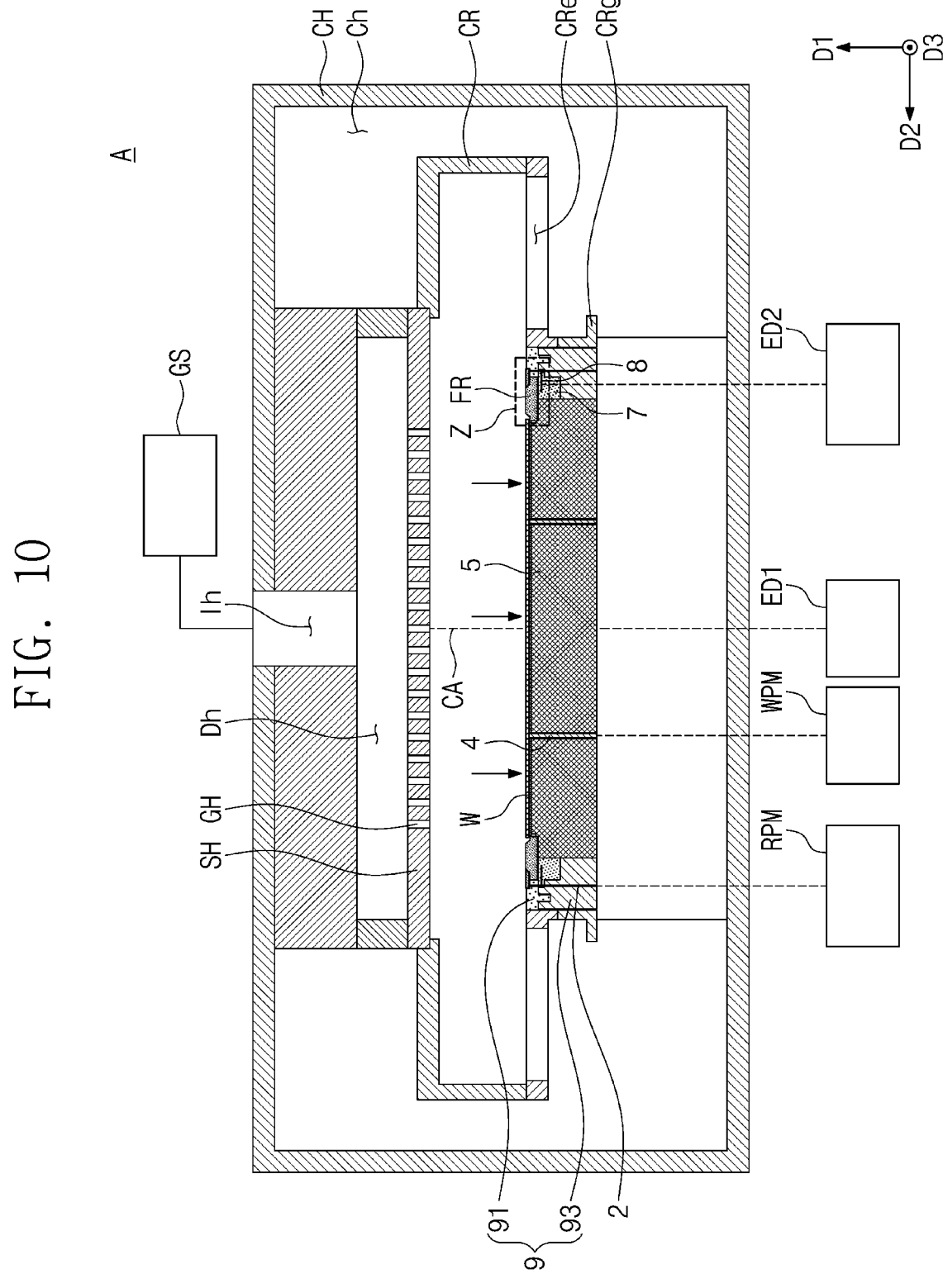
Figure 11:
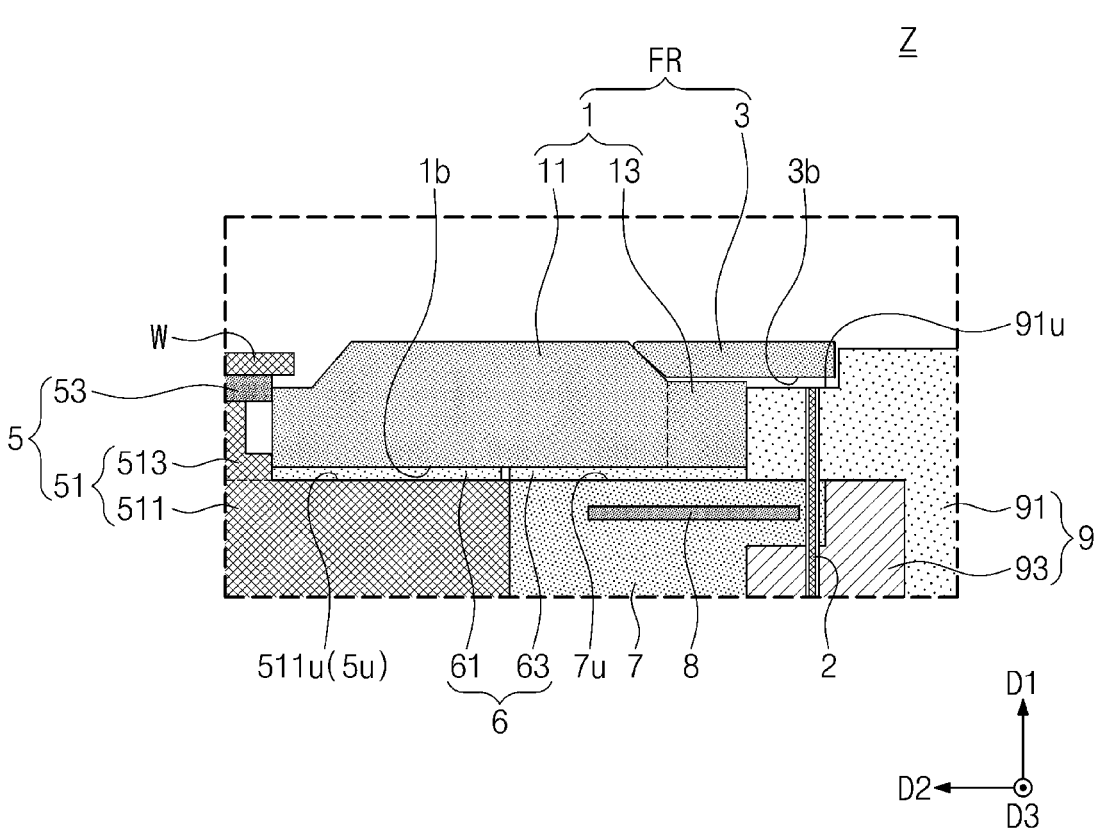

Referring to FIGS. 10 and 11, the lift pin driver WPM may lower the substrate lift pin 4. The substrate W may be disposed on the electrostatic chuck 5. For example, the substrate W may rest on a top surface of the chuck 53. The chuck 53 may use an electrostatic force provided from the chuck electrode to thereby fix the substrate W to a certain location.

Figure 12:
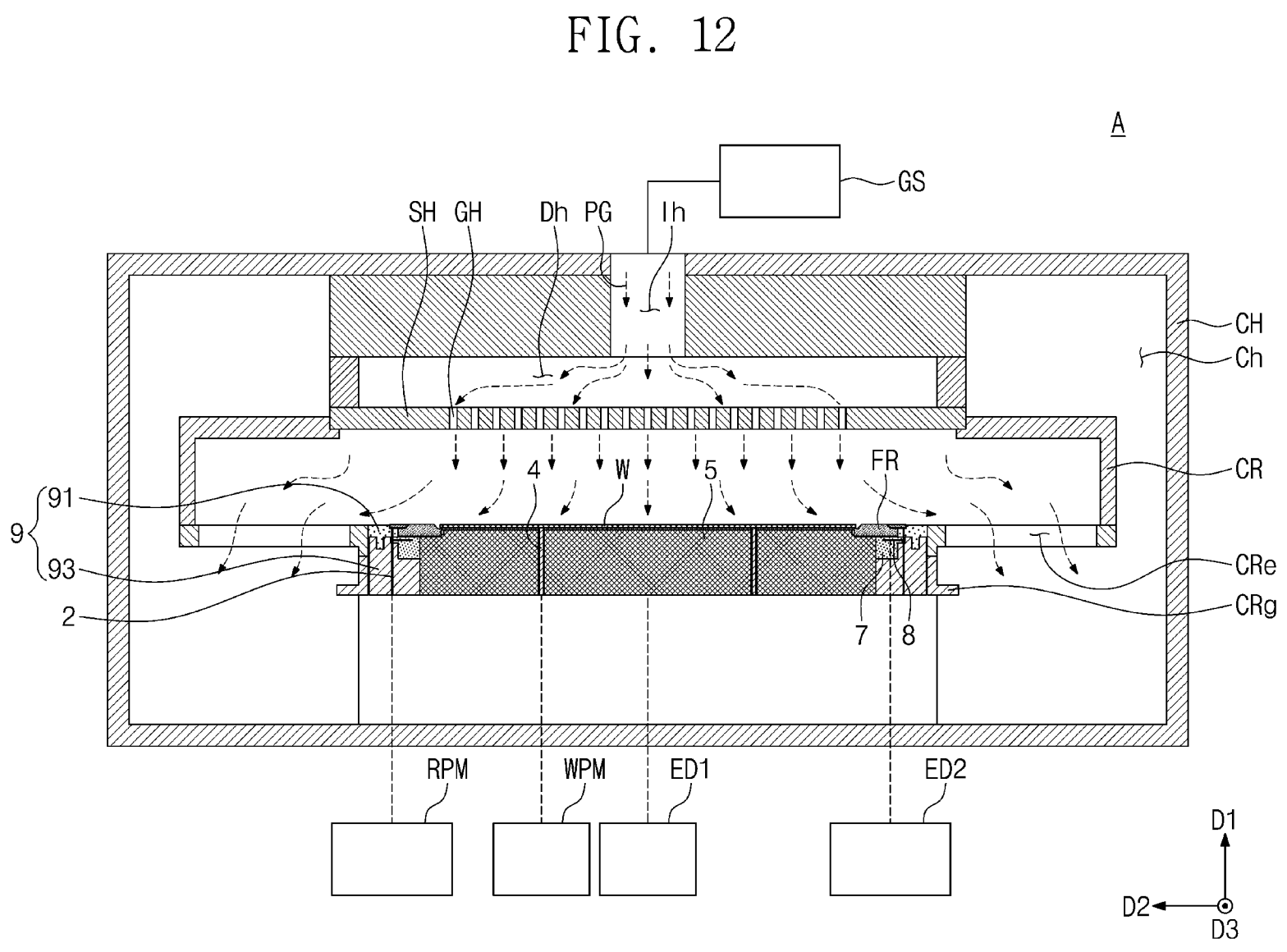

Referring to FIGS. 8 and 12, the gas supply step S2 may include allowing the gas supply GS to supply a process gas PG into the process chamber CH. The process gas PG may pass through the gas inlet Ih, the distribution space Dh, and the distribution hole GH, thereby flowing to the substrate W.

Figure 13:
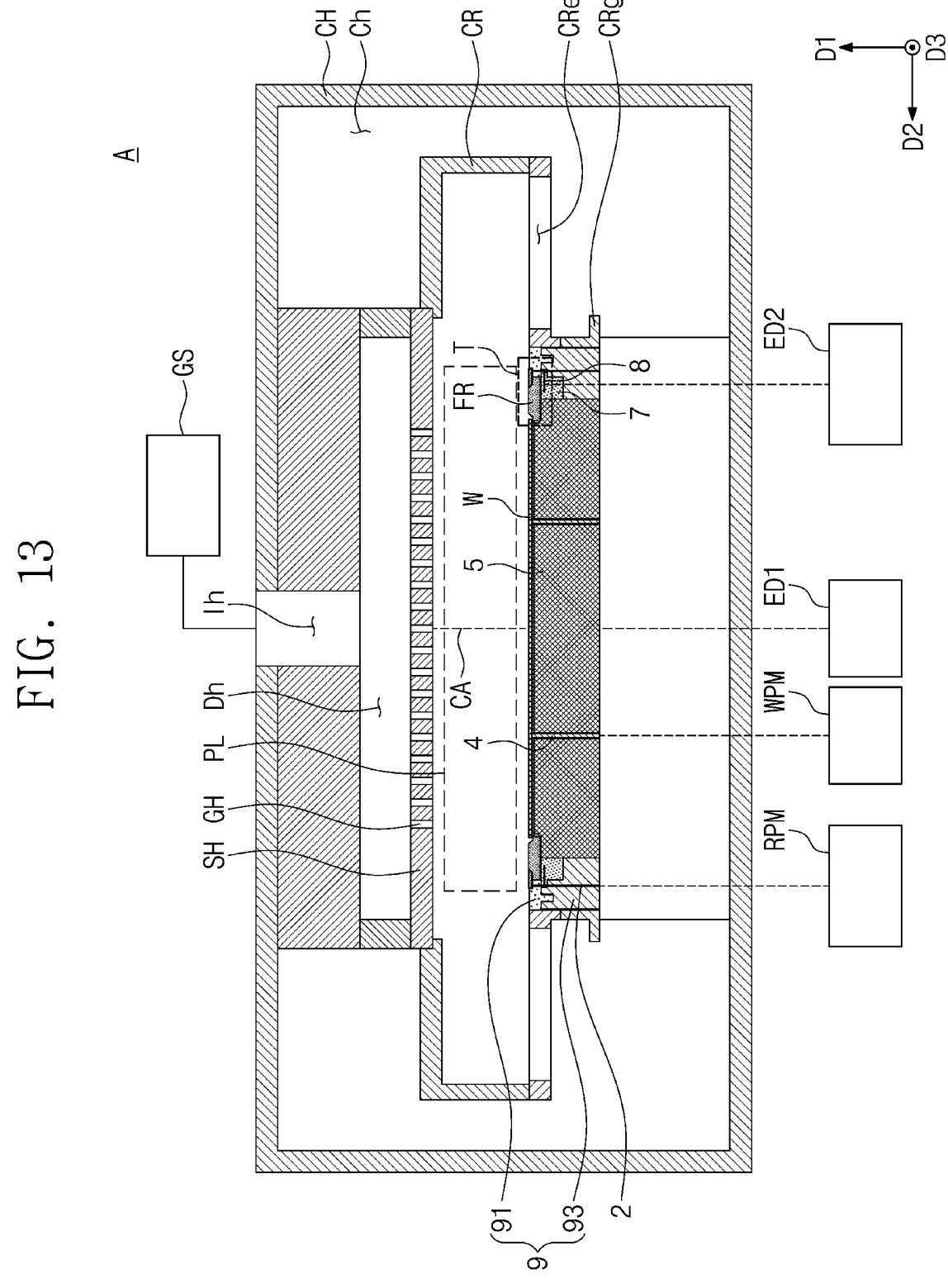
Figure 14:
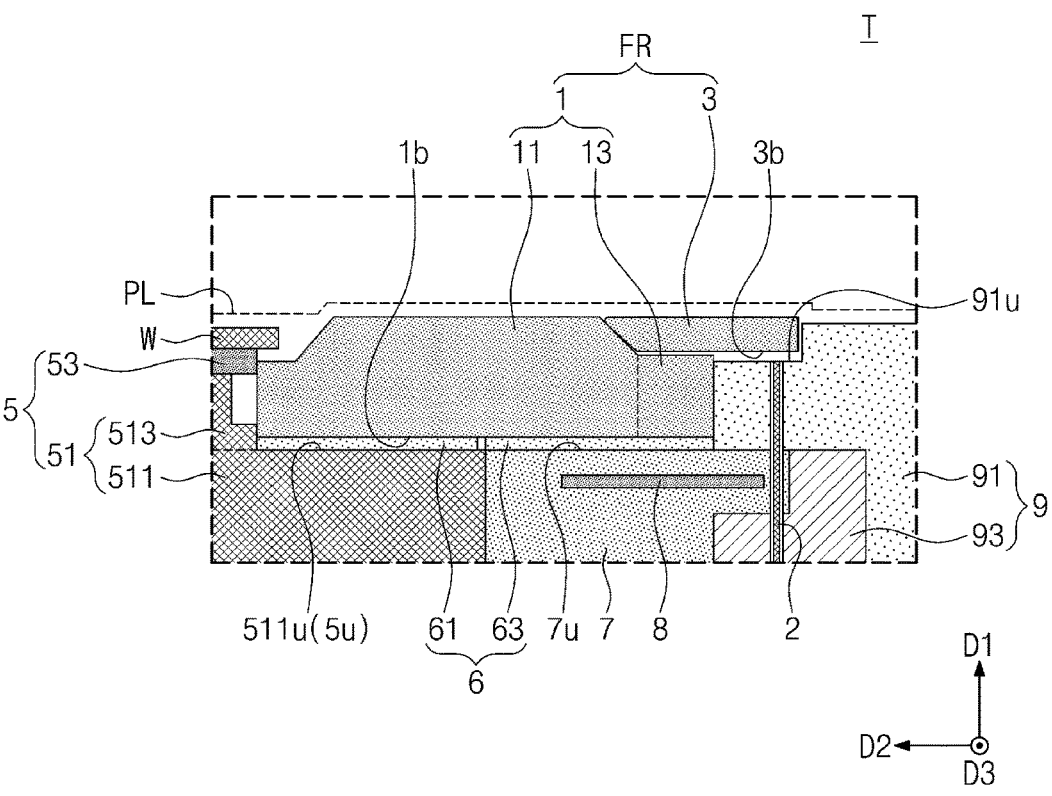

Referring to FIGS. 8, 13, and 14, the first RF power step S3 may include allowing the first RF power supply ED1 to transfer the first RF power to the plasma electrode 51. The plasma electrode 51 to which the first RF power is applied may form an electric field in a space on the substrate W. The electric field may be formed in the space filled with the process gas PG, and the process gas GH may be converted into plasma PL. The substrate W may undergo a treatment process that uses the plasma PL. For example, the plasma PL may etch a top surface of the substrate W to form at least part of a pattern of an integrated circuit, for example. During this process, the focus ring FR may function to control plasma density and to cause plasma to be evenly concentrated above the substrate W. For example, the ring-shaped material that forms the focus ring FR may supplement the outer electrode 8 in focusing the plasma to be evenly concentrated above the substrate W. In particular, the added second ring, by extending wider than the first ring, assists in this function.

The second RF power step S4 may include allowing the second RF power supply ED2 to transfer the second RF power to the outer electrode 8. The second RF power may be distinguished from the first RF power. For example, the first RF power may be about 60 MHz, and the second RF power may be about 400 kMz. The second RF power applied to the outer electrode 8 may form an electric field in a space on the outer electrode 8. Therefore, it may be possible to control behavior of the plasma PL present in the space on the outer electrode 8.

Figure 15:
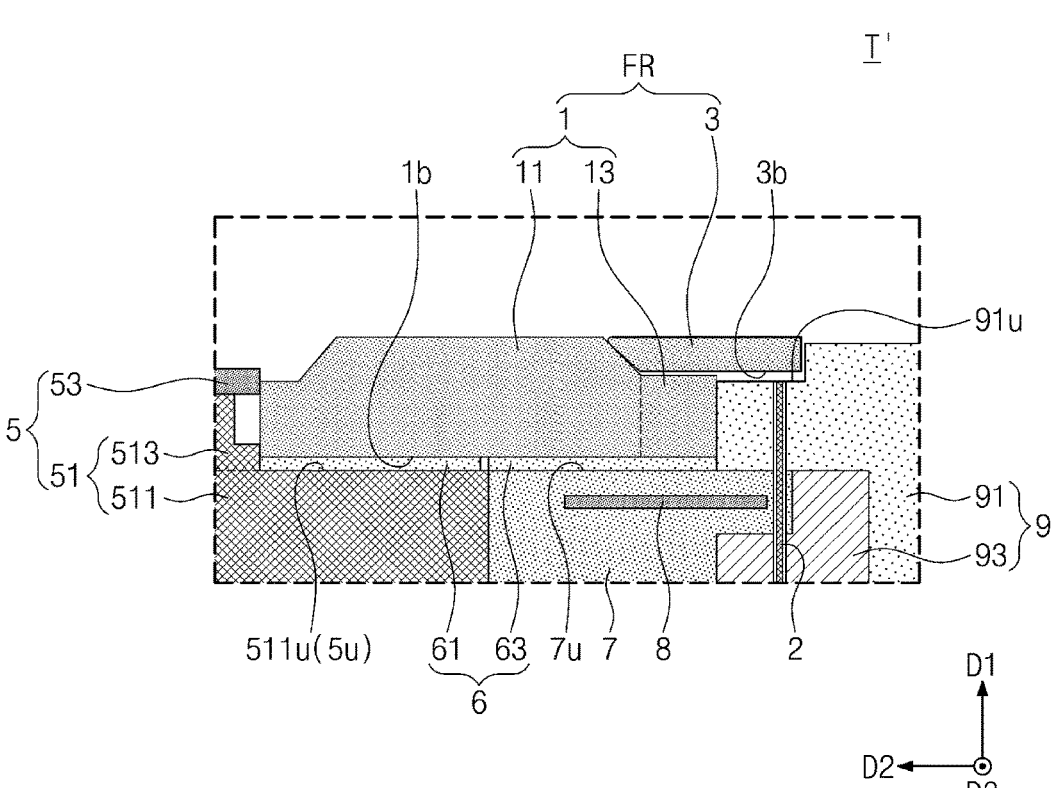

Referring to FIGS. 8 and 15, in the substrate removal step S5 the substrate W that has been processed may be removed from the electrostatic chuck 5, and may be delivered outwardly from the process chamber CH. In this procedure, the substrate lift pin (see 4 of FIG. 9) may rise to lift the substrate W from the electrostatic chuck 5. The robot arm may deliver the substrate W outwardly from the process chamber CH. Though not shown, the substrate W may then be processed in subsequent processes, such as additional etching, layer deposition, dicing, and/or combining with other substrates or semiconductor chips to result in a device such as a semiconductor chip or semiconductor package.

Figure 16:
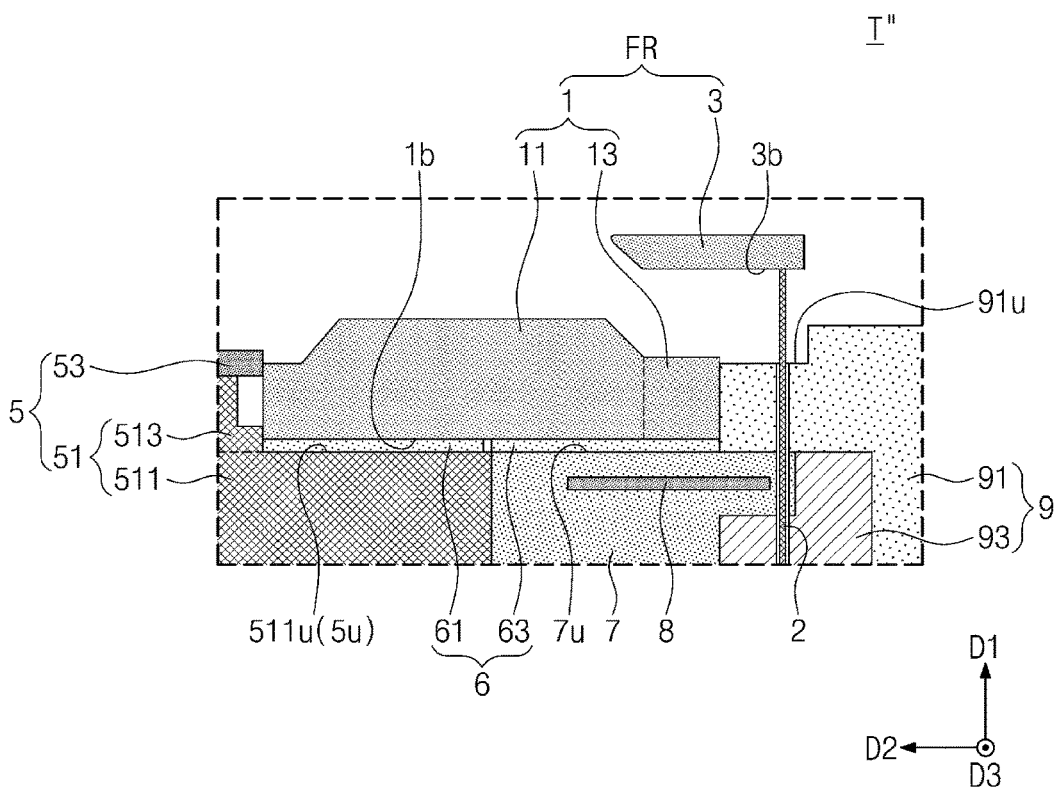

Referring to FIGS. 8 and 16, the ring ascent step S61 may include allowing the second ring 3 to rise and separate from the first ring 1. For example, the ring lift pin 2 may ascend to lift the second ring 3 from the first ring 1. Because the second ring 3 is disposed on and in linear contact with the first ring 1, the ring lift pin 2 may be used to easily separate the second ring 3 from the first ring 1. The robot arm may deliver the second ring 3, which is separated from the first ring 1, outwardly from the process chamber CH.

The new placement step S62 may include placing a new second ring on the ring lift pin 2. The ring lift pin 2 may descend to place the new second ring on the first ring 1. Afterwards, a series of steps starting from the substrate placement step S1 may be performed again identically or similarly.

According to a focus ring, a substrate processing apparatus including the same, and a substrate processing method using the same in accordance with some embodiments of the present inventive concepts, the focus ring may be divided into two or more pieces, and at least one of the divided pieces may be replaced. For example, a second ring at an outer side of the focus ring may be separated from a first ring at an inner side of the focus ring, and the separated second ring may be replaced with new second ring. Each of the different second rings may rest firmly on the first ring without the need for any fastening mechanism, to allow for easy removal and replacement. A plurality of second rings having different diameters may be used to select a second ring having an optimum diameter. Therefore, it may be possible to effectively control a density distribution of plasma on the second ring.

According to a focus ring, a substrate processing apparatus including the same, and a substrate processing method using the same in accordance with some embodiments of the present inventive concepts, an outer electrode distinguished from a plasma electrode may be used to independently control the plasma on an edge region. The outer electrode may be provided with a radio-frequency (RF) power separately from a RF power applied to the plasma electrode, and thus it may be possible to generate an electric field on the outer electrode while reducing an effect on the plasma electrode. Accordingly, the plasma on the edge region may be independently controlled.

According to a focus ring, a substrate processing apparatus including the same, and a substrate processing method using the same in accordance with some embodiments of the present inventive concepts, a ring lift pin may be used to replace only a second ring promptly and simply. For example, only the ring lift pin and a robot arm may be used to promptly replace the second ring between processes without dissembling equipment. Therefore, it may be possible to reduce a process time and to increase a process yield.

According to a focus ring, a substrate processing apparatus including the same, and a substrate processing method using the same in accordance with some embodiments of the present inventive concepts, the first ring may decrease in area exposed to the plasma. Therefore, heat transfer may be reduced from a high-temperature fluid to the first ring. In addition, as the first ring is coupled to an electrostatic chuck and/or a coupling ring, heat may be satisfactorily and downwardly discharged from the first ring. When a width at a bottom surface of the first ring is greater than that at a top surface of the first ring, a thermal radiation area may be greater than a thermal absorption area. Therefore, the first ring may be effectively cooled down. When the first ring is in contact with the electrostatic chuck and/or the coupling ring through a heat transfer pad, a contact area between interfaces may be increased to achieve effective thermal radiation. Thus, the first ring may be maintained at a relatively low temperature. The relatively low temperature of the first ring may induce deflection of polymer particles toward the first ring. Accordingly, during fabrication, a substrate may be prevented from being adhered with polymer particles. As a result, the substrate may increase in etching yield.

According to a focus ring, a substrate processing apparatus including the same, and a substrate processing method using the same in accordance with some embodiments of the present inventive concepts, the second ring may cover a portion of the first ring. Thus, the second ring may absorb a portion of heat transmitted to the first ring. A relatively small contact area may be provided between the second ring and the first ring. When the second ring is in linear contact with the first ring, heat absorbed in the second ring may be prevented from being transmitted to the first ring. In addition, the second ring may have a bottom surface spaced apart from a top surface of a protrusion member, and thus heat absorbed in the second ring may be prevented from being transmitted to the first ring. Therefore, the temperature of the first ring may be prevented from rising above a certain value. The ring lift pin may easily replace the second ring whose temperature is increased.

According to a focus ring, a substrate processing apparatus including the same, and a substrate processing method using the same in accordance with some embodiments of the present inventive concepts, the second ring may be disposed on and in linear contact with the first ring. In addition, the second ring may be upwardly spaced apart from a quartz ring, and thus the second ring and the first ring may be simply and accurately aligned with each other. Accordingly, the first ring and the second ring may be assembled promptly and accurately.

FIGS. 17 to 27 illustrate cross-sectional views partially showing a substrate processing apparatus according to some embodiments of the present inventive concepts.

For convenience of description, the following will omit an explanation of components substantially the same as or similar to those discussed with reference to FIGS. 1 to 16.

Figure 17:
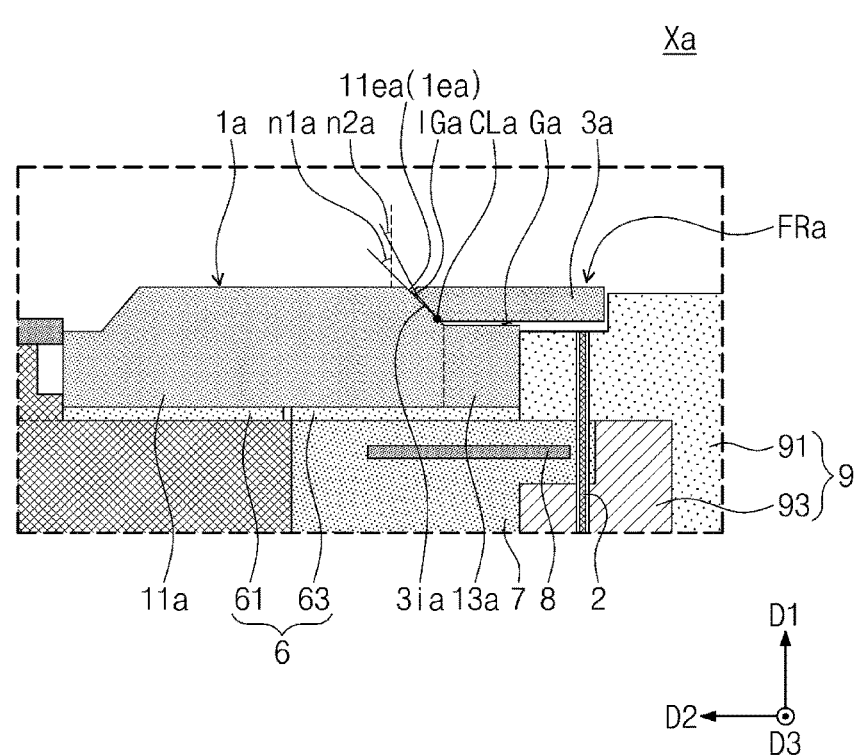
FIGS. 17 to 27 illustrate cross-sectional views partially showing a substrate processing apparatus according to some embodiments of the present inventive concepts.

Referring to FIG. 17, a focus ring FRa may include a first ring 1*a* and a second ring 3*a*. The first ring 1*a* may include a first ring body 11*a* and a protrusion member 13*a*. The second ring 3*a* may have an inner lateral surface 3*ia* steeper than an outer lateral surface lea of the first ring 1*a*. For example, a first angle n1*a* may be greater than a second angle n2*a*. Above a contact line CLa, the inner lateral surface 3*ia* of the second ring 3*a* may be upwardly spaced apart from the outer lateral surface lea of the first ring 1*a*, and an inclination gap IGa may be formed between the inner lateral surface 3*ia* and the outer lateral surface lea. The inclination gap IGa may not be spatially connected to a gap Ga. In this manner, the linear contact region between the first ring 1*a* and second ring 3*a* may be at a bottom portion of inner lateral surface 3*ia* and outer lateral surface lea.

Figure 18:
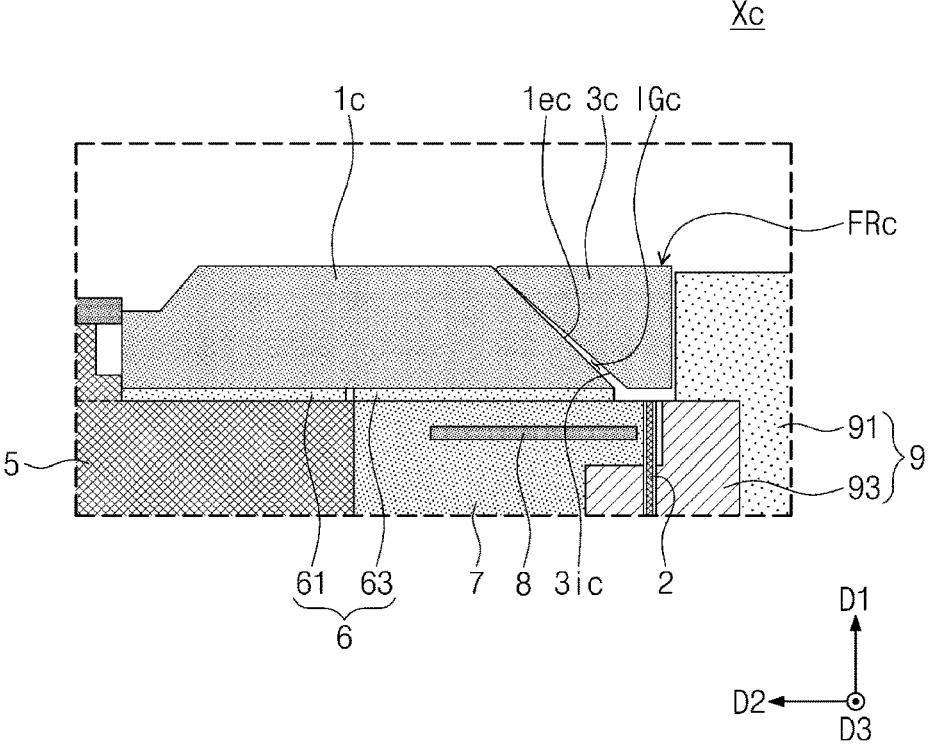

Referring to FIG. 18, a focus ring FRc may include a first ring 1*c* and a second ring 3*c*. The first ring 1*c* may include no protrusion member. The first ring 1*c* may have an outer lateral surface 1*ec* in linear contact with an inner lateral surface 3*ic* of the second ring 3*c*. An inclination gap IGc may be exposed to a top surface of the coupling ring 7. The second ring 3*c* may have a bottom surface 3*bc* that faces the top surface of the coupling ring 7. The bottom surface 3*bc* of the second ring 3*c* may be upwardly spaced apart from the top surface of the coupling ring 7. The embodiment of FIG.

18 does not include the protrusion member of the previously-described embodiments.

Figure 19:
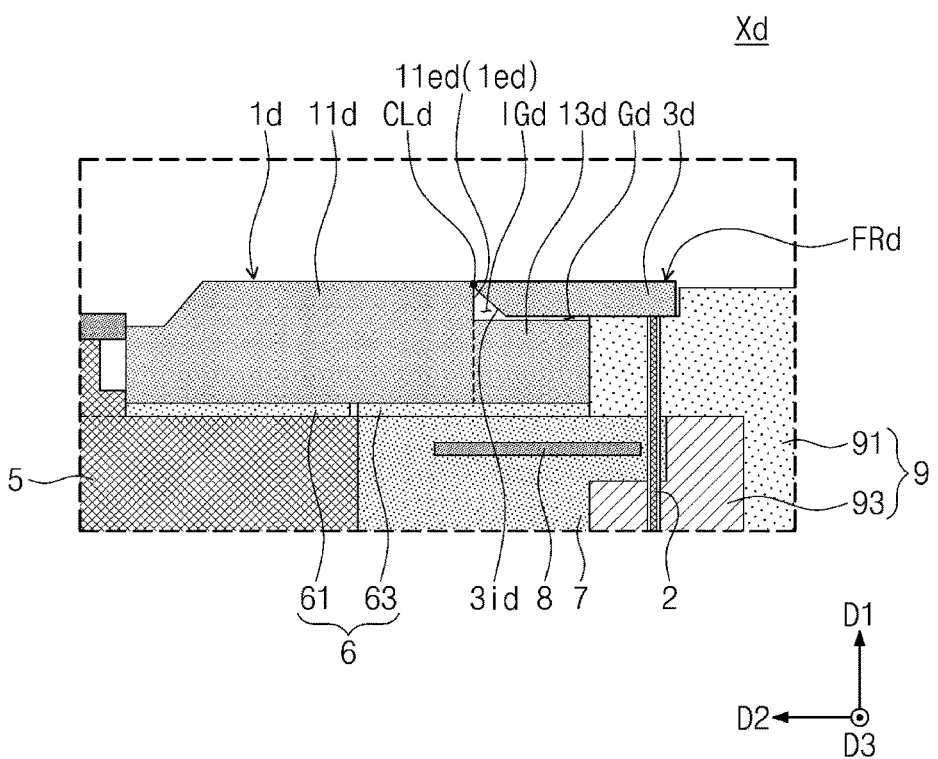

Referring to FIG. 19, a focus ring FRd may include a first ring 1*d* and a second ring 3*d*. The first ring 1*d* may include a first ring body 11*d* and a protrusion member 13*d*. The first ring 1*d* may have an outer lateral surface led substantially parallel to the first direction D1. The outer lateral surface led of the first ring 1*d* may be in linear contact with an inner lateral surface 3*id* of the second ring 3*d*. Below a contact line CLd, the inner lateral surface 3*id* of the second ring 3*d* may be upwardly spaced apart from the outer lateral surface led of the first ring 1*d*, with the result that an inclination gap IGd may be formed. The inclination gap IGd may be spatially connected to a gap Gd. The second ring 3*d* may be supported by a portion of an outer ring 9 (e.g., a quartz ring 91).

Figure 20:
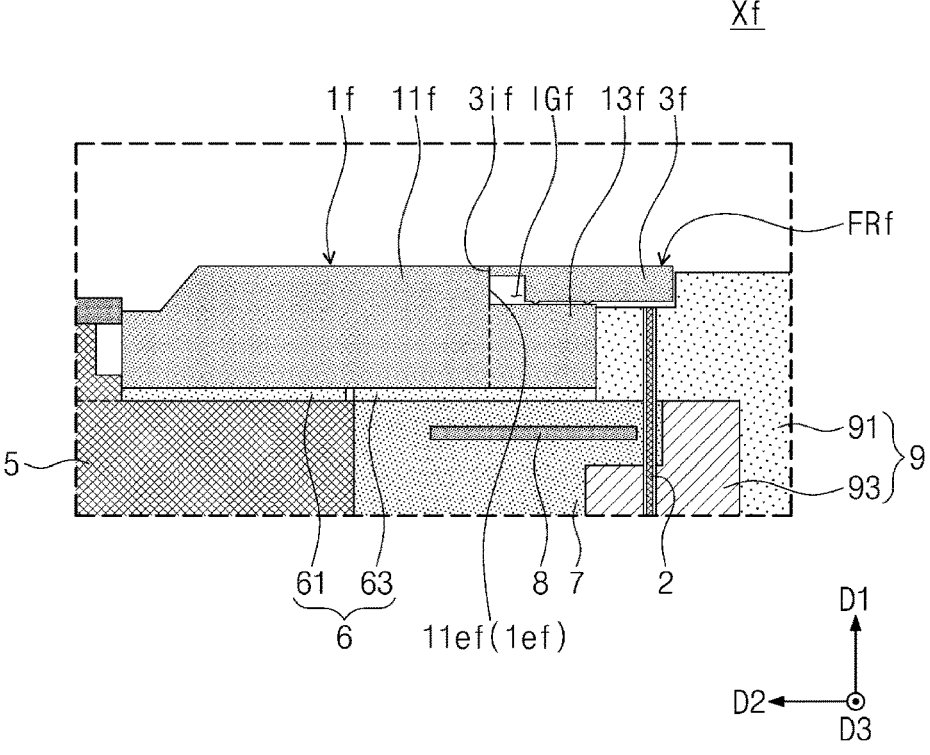

Referring to FIG. 20, a focus ring FRf may include a first ring if and a second ring 3*f*. The first ring if may include a first ring body 11*f* and a protrusion member 13*f*. The second ring 3*f* may have an inner lateral surface 3*if* substantially parallel to the first direction D1. The first ring if may have an outer lateral surface 1*ef* in linear contact with the inner lateral surface 3*if* of the second ring 3*f*. An inclination gap IGf may be provided below the inner lateral surface 3*if* of the second ring 3*f* The second ring 3*f* may include a support member (not designated by a reference numeral) coupled to a bottom surface thereof. The support member may support the second ring 3*f* on the protrusion member 13*f* and/or the quartz ring 91.

Figure 21:
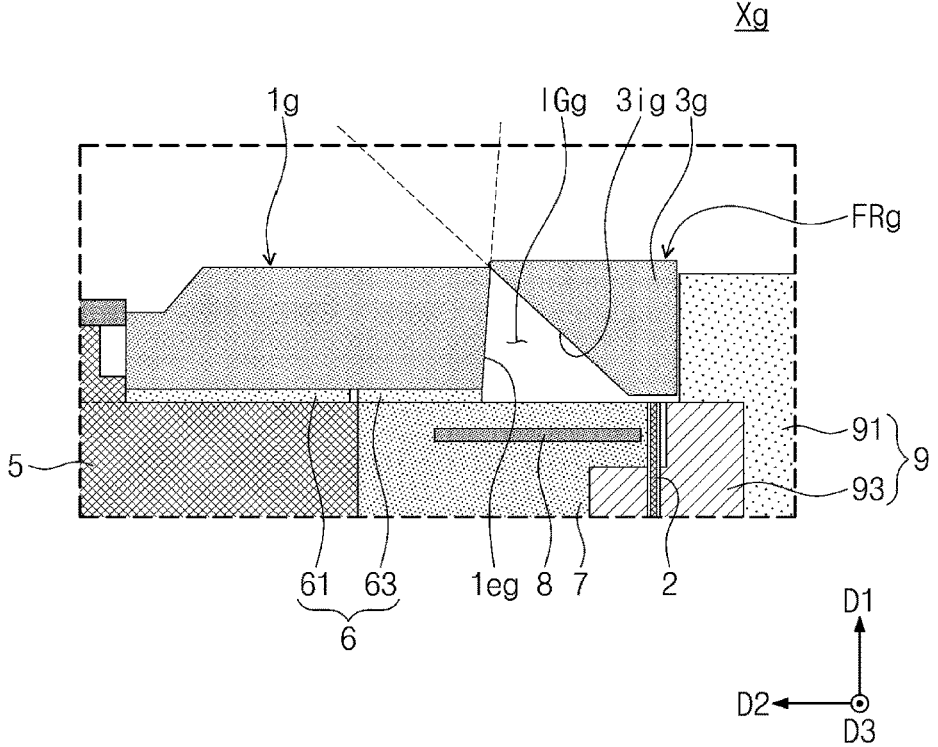

Referring to FIG. 21, a focus ring FRg may include a first ring 1*g* and a second ring 3*g*. The first ring 1*g* may have an outer lateral surface leg that slopes upwardly and outwardly. The second ring 3*g* may have an inner lateral surface 3*ig* in linear contact with the outer lateral surface leg of the first ring 1*g*. An inclination gap IGg may be provided between the inner lateral surface 3*ig* of the second ring 3*g* and the outer lateral surface leg of the first ring 1*g*. The second ring 3*g* may have a top surface at a higher level than that of a top surface of the first ring 1*g*.

Figure 22:
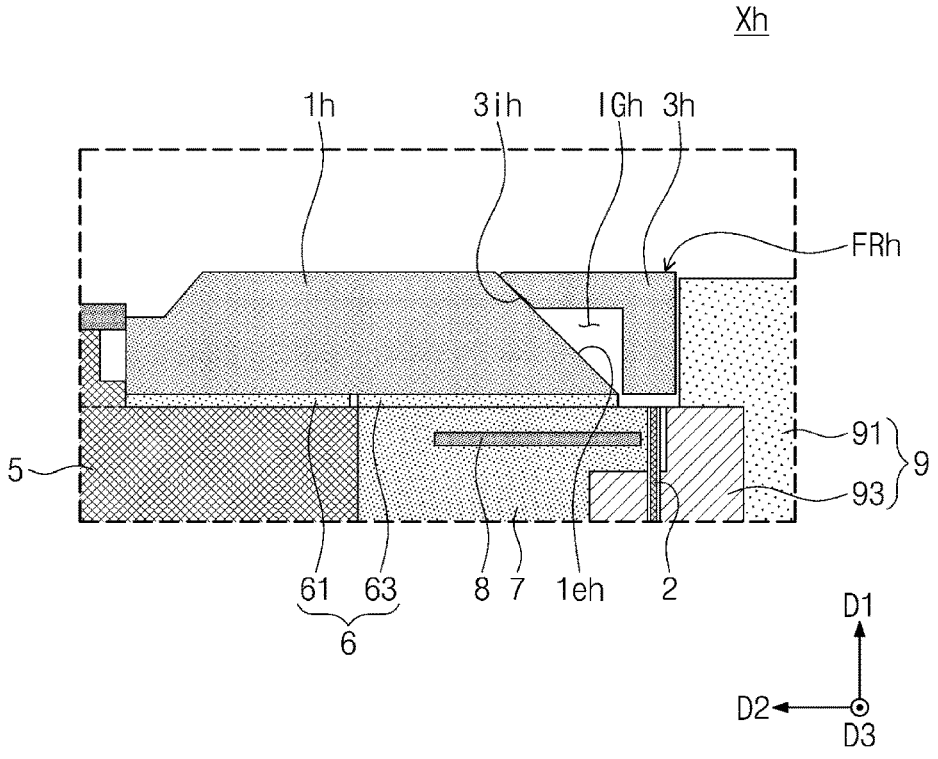

Referring to FIG. 22, a focus ring FRh may include a first ring 1*h* and a second ring 3*h*. The second ring 3*h* may have a stepped structure at an inner lateral surface 3*ih* thereof. An inclination gap IGh may be provided between an outer lateral surface 1*eh* of the first ring 1*h* and the inner lateral surface 3*ih* of the second ring 3*h*.

Figure 23:
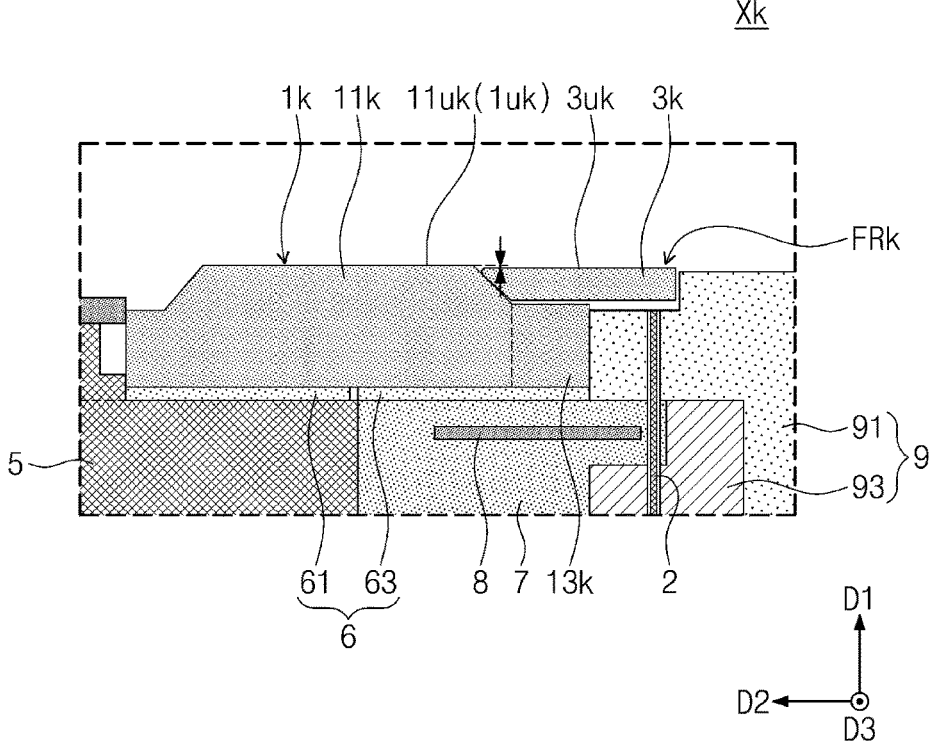

Referring to FIG. 23, a focus ring FRk may include a first ring 1*k* and a second ring 3*k*. The first ring if may include a first ring body 11*f* and a protrusion member 13*f*. The second ring 3*k* may have a top surface 3*uk* at a lower level than that of a top surface 11*uk* of the first ring body 11.

Figure 24:
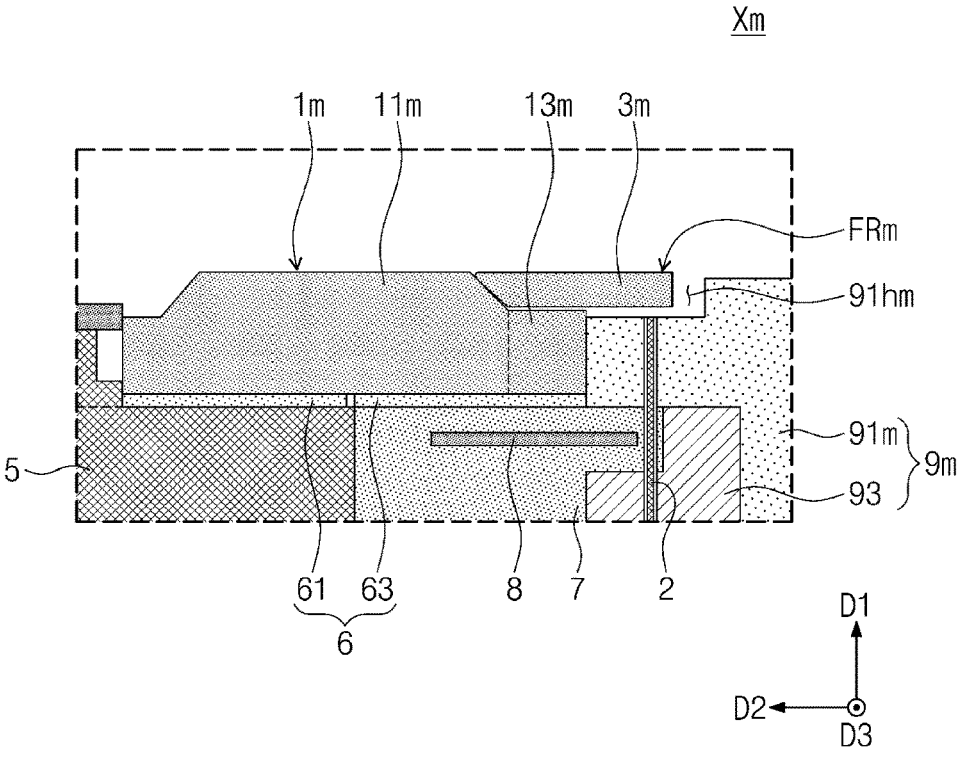

Referring to FIG. 24, a focus ring FRm may include a first ring 1*m* and a second ring 3*m*. The first ring 1*m* may include a first ring body 11*m* and a protrusion member 13*m*. An outer ring 9*m* may include a quartz ring 91*m* and a ground ring 93. The quartz ring 91*m* may provide a placement recess 91*hm* so that an inner wall of quartz ring 91*m* has a larger diameter than the second ring 3*m*. Therefore, the quartz ring 91 may be provided thereon with different second rings 3*m* that are variously sized.

Figure 25:
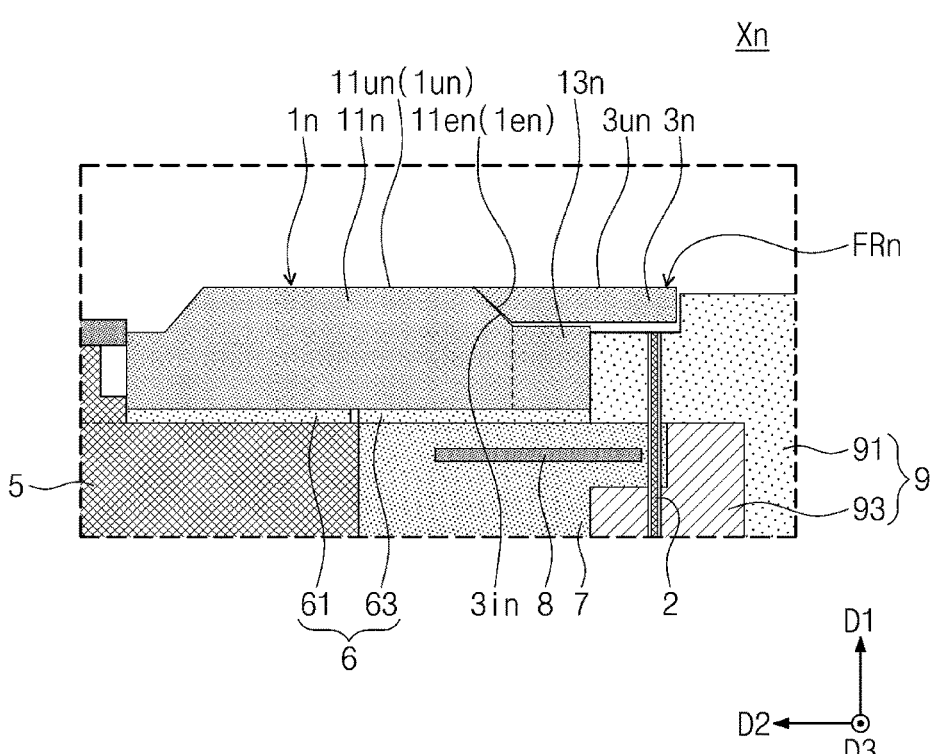

Referring to FIG. 25, a focus ring FRn may include a first ring 1*n* and a second ring 3*n*. The first ring 1*n* may include a first ring body 11*n* and a protrusion member 13*n*. The first ring 1*n* may have an outer lateral surface 1*en* in linear contact with an inner lateral surface 3*in* of the second ring 3*n*. The inner lateral surface 3*in* of the second ring 3*n* may be directly connected to a top surface 3*un* of the second ring 3*n*. The inner lateral surface 3*in* of the second ring 3*n* may be straight in a cross section view taken along a plane including the axis (see CA of FIG. 3). The first ring 1n may have a top surface 1un at a level substantially the same as that of the top surface 3un of the second ring 3n. In addition, the top surface 3un of the second ring 3n may be connected to the top surface 1un of the first ring 1n.

Figure 26:
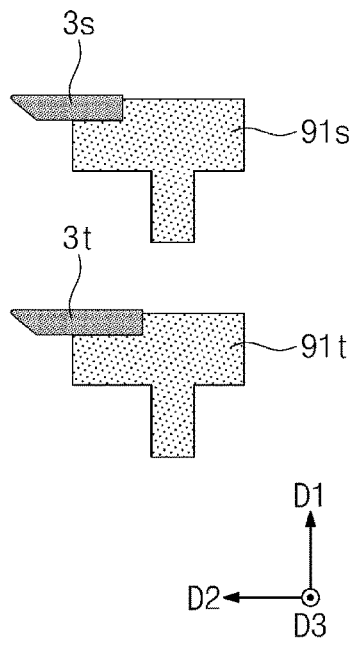

Referring to FIG. 26, a second ring 3s/3t and a quartz ring 91s/91t may be integrally connected into a single unitary piece. Therefore, when the second ring 3s/3t is replaced, the quartz ring 91s/91t may also be replaced. A second ring and a quartz ring may all be replaced to use another second ring having a different diameter.

Figure 27:
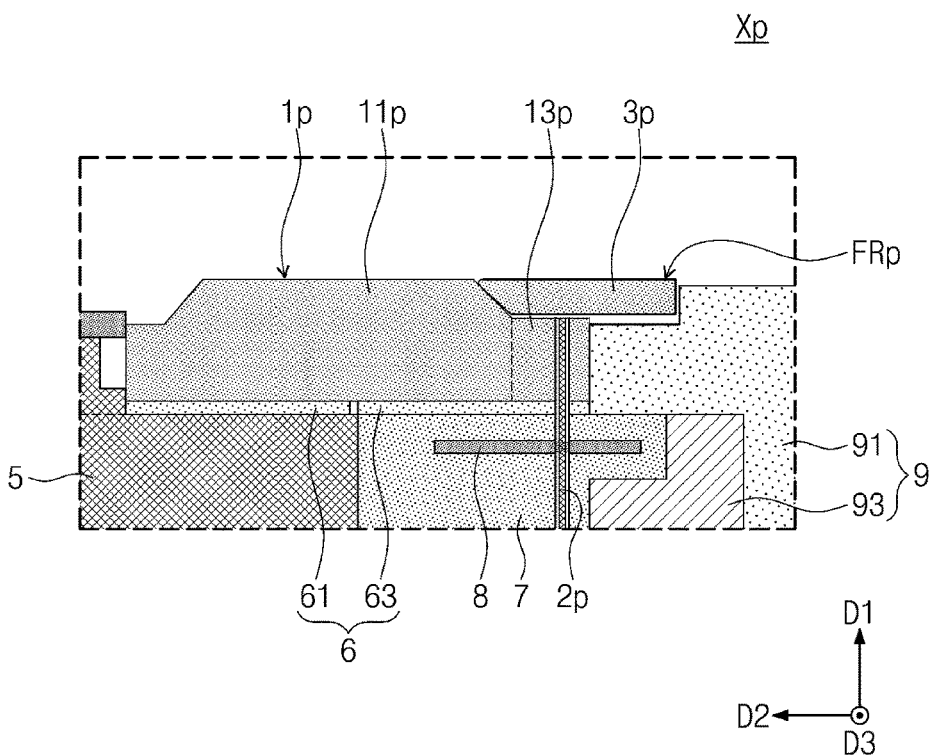

Referring to FIG. 27, a focus ring FRp may include a first ring 1p and a second ring 3p. The first ring 1p may include a first ring body 11p and a protrusion member 13p. A ring lift pin 2p may vertically penetrate the first ring 1p. For example, the ring lift pin 2p may vertically penetrate the coupling ring 7, the outer electrode 8, the second heat transfer pad 63, and the protrusion member 13p. The protrusion member 13p may provide a pin through insertion hole (not designated by a reference numeral). The ring lift pin 2p may be exposed on a top surface of the protrusion member 13p.

According to a focus ring, a substrate processing apparatus including the same, and a substrate processing method using the same of the present inventive concepts, plasma on an edge region may be independently controlled.

According to a focus ring, a substrate processing apparatus including the same, and a substrate processing method using the same of the present inventive concepts, a portion of the focus ring may be replaced automatically and promptly.

According to a focus ring, a substrate processing apparatus including the same, and a substrate processing method using the same of the present inventive concepts, a temperature of the focus ring may be reduced to increase a substrate etching yield.

Effects of the present inventive concepts are not limited to the mentioned above, other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A focus ring for a substrate processing apparatus, comprising:
a first ring formed around an axis that extends in a first direction; and
a second ring separate from the first ring, and formed around the axis,
wherein a first portion of an inner lateral surface of the second ring, which inner lateral surface faces the axis, contacts a first portion of an outer lateral surface of the first ring, which outer lateral surface faces away from the axis, and a second portion of the inner lateral surface of the second ring does not contact the outer lateral surface of the first ring, and
wherein, when viewed in a cross-sectional view from a direction perpendicular to the axis, a first acute angle between the first direction and a line formed by the outer lateral surface is different from a second acute angle between the first direction and a line formed by the inner lateral surface when viewed in the cross-sectional view from the direction perpendicular to the axis.

2. The focus ring of claim 1, wherein
the first acute angle is less than the second acute angle, and
below a contact line where the inner lateral surface and the outer lateral surface contact each other, the inner lateral surface is spaced apart from the outer lateral surface to form an inclination gap between the inner lateral surface and the outer lateral surface.

3. The focus ring of claim 1, wherein the first ring includes a protrusion member that extends outwardly from and below the outer lateral surface,
wherein a top surface of the protrusion member is at a level lower than a level of the outer lateral surface, and
wherein at least a portion of the second ring is on the protrusion member.

4. The focus ring of claim 3, wherein a bottom surface of the second ring is vertically spaced apart from the top surface of the protrusion member to form a gap between the second ring and the protrusion member.

5. The focus ring of claim 3, wherein a length in a horizontal direction of the second ring is greater than a length in the same horizontal direction of the protrusion member to allow a portion of the second ring to protrude outwardly from the protrusion member.

6. The focus ring of claim 3, wherein a top surface of the second ring is positioned on the same plane as a top-most surface of a first ring body provided at an inner side of the protrusion member.

7. A substrate processing apparatus, comprising:
an electrostatic chuck;
a focus ring on the electrostatic chuck; and
an outer ring that surrounds the focus ring,
wherein the focus ring includes:
a first ring; and
a second ring,
wherein the first ring includes:
a first ring body; and
a protrusion member that extends outwardly from the first ring body,
wherein:
a top-most surface of the protrusion member is at a vertical level lower than a vertical level of a top-most surface of the first ring body,
a first portion of the second ring is on the protrusion member,
a second portion of the second ring is on the outer ring,
the first ring body has an outer lateral surface that slopes downwardly and outwardly,
the second ring has an inner lateral surface that slopes downwardly and outwardly,
with respect to a vertical line, an inclination of the outer lateral surface is greater than an inclination of the inner lateral surface, and
a bottom surface of the second ring is vertically spaced apart from and not in contact with the top-most surface of the protrusion member to form a gap between the second ring and the protrusion member.

8. The apparatus of claim 7, wherein
a vertical level of the outer lateral surface is higher than the vertical level of the top-most surface of the protrusion member, and
a portion of the inner lateral surface contacts a portion of the outer lateral surface.

9. The apparatus of claim 8, wherein, below a contact line where the inner lateral surface and the outer lateral surface contact each other, the inner lateral surface is spaced apart from the outer lateral surface to form an inclination gap between the inner lateral surface and the outer lateral surface, wherein the inclination gap is connected to the gap.

10. The apparatus of claim 7, wherein a height of the gap is in a range of about 0.05 mm to about 0.2 mm.

11. The apparatus of claim 7, further comprising a first heat transfer pad between the first ring body and the electrostatic chuck, the first heat transfer pad contacting a bottom surface of the first ring body and a top surface of the electrostatic chuck.

12. The apparatus of claim 7, further comprising a coupling ring below the focus ring, the coupling ring surrounding the electrostatic chuck, wherein an outer electrode is in the coupling ring.

13. The apparatus of claim 7, wherein a thickness of the first ring body is in a range of about 4.5 mm to about 8.5 mm, and a thickness of the second ring is in a range of about 1 mm to about 3 mm.

14. A substrate processing apparatus, comprising:

an electrostatic chuck;

a focus ring on the electrostatic chuck; and a ring lift pin that extends in a first direction, wherein the focus ring includes:

a first ring formed around an axis that is parallel to the first direction; and a second ring not affixed to the first ring, wherein:

the ring lift pin is disposed below the second ring, a portion of an inner lateral surface of the second ring contacts a portion of an outer lateral surface of the first ring, and a first acute angle between the first direction and a line formed by the outer lateral surface when viewed in a cross-sectional view from a direction perpendicular to the axis is different from a second acute angle between the first direction and a line formed by the inner lateral surface when viewed in the cross-sectional view from the direction perpendicular to the axis.

15. The apparatus of claim 14, wherein the ring lift pin is outside the first ring with respect to the axis.

16. The apparatus of claim 14, wherein the first ring provides a pin through-insertion hole that extends in the first direction, and the ring lift pin passes through the pin through-insertion hole.

17. The apparatus of claim 14, wherein the electrostatic chuck includes:

a plasma electrode; and a chuck on the plasma electrode, wherein the plasma electrode includes:

an electrode body; and a plateau between the electrode body and the chuck, wherein a diameter of the plateau is less than a diameter of the electrode body, wherein the first ring surrounds the plateau and is on a top surface of the electrode body, and wherein a first heat transfer pad is provided between and contacts a bottom surface of the first ring and the top surface of the electrode body.

18. The apparatus of claim 17, further comprising a coupling ring that surrounds the electrode body and is below the focus ring, wherein the coupling ring provides a pin insertion hole that extends in the first direction, and wherein the ring lift pin is inserted into the pin insertion hole.

19. The apparatus of claim 18, further comprising a second heat transfer pad provided between and contacting the bottom surface of the first ring and a top surface of the coupling ring.

* * * * *